(12) United States Patent
Narumi et al.

(10) Patent No.: US 12,248,140 B2
(45) Date of Patent: Mar. 11, 2025

(54) OPTICAL DEVICE

(71) Applicant: Panasonic Intellectual Property Management Co., Ltd., Osaka (JP)

(72) Inventors: Kenji Narumi, Osaka (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 479 days.

(21) Appl. No.: 17/695,743

(22) Filed: Mar. 15, 2022

(65) Prior Publication Data

US 2022/0206288 A1 Jun. 30, 2022

Related U.S. Application Data

(63) Continuation of application No. PCT/JP2020/029912, filed on Aug. 5, 2020.

(30) Foreign Application Priority Data

Sep. 27, 2019 (JP) .................................. 2019-176746

(51) Int. Cl.
*G02B 26/08* (2006.01)
*G02B 26/10* (2006.01)
*G02B 27/09* (2006.01)

(52) U.S. Cl.
CPC .......... *G02B 26/10* (2013.01); *G02B 26/0816* (2013.01); *G02B 27/0955* (2013.01); *G02B 27/0983* (2013.01)

(58) Field of Classification Search
CPC ............ G02B 26/10; G02B 26/0816; G02B 27/0955; G02B 27/0983; G02B 3/00; G02B 3/06; G02B 5/02; G02B 5/10; G01S 7/481; G01S 17/93; G02F 1/29; H01S 5/026

See application file for complete search history.

(56) References Cited

U.S. PATENT DOCUMENTS

| | | |
|---|---|---|
| 2006/0285078 A1 | 12/2006 | Kasazumi et al. |
| 2018/0217258 A1 | 8/2018 | Hirasawa et al. |
| 2018/0224709 A1 | 8/2018 | Inada et al. |
| 2019/0033522 A1* | 1/2019 | Baba ................. G02B 6/125 |

(Continued)

FOREIGN PATENT DOCUMENTS

| | | |
|---|---|---|
| JP | 5-034733 | 2/1993 |
| JP | 9-133887 | 5/1997 |

(Continued)

OTHER PUBLICATIONS

International Search Report of PCT application No. PCT/JP2020/029912 dated Oct. 20, 2020.

*Primary Examiner* — Euncha P Cherry
(74) *Attorney, Agent, or Firm* — Rimon P.C.

(57) ABSTRACT

An optical device includes an optical deflector that emits, through a light exit surface parallel to a first direction and a second direction intersecting the first direction and in a direction intersecting the light exit surface, an optical beam having a shape extending in the second direction and that is configured to cause a direction of emission of the optical beam to change along the first direction and an optical element, placed on a path of the optical beam, that expands an extent of spread of the optical beam in the second direction.

14 Claims, 29 Drawing Sheets

(56) References Cited

U.S. PATENT DOCUMENTS

2019/0129085 A1 5/2019 Waldern et al.
2019/0204419 A1 7/2019 Baba et al.

FOREIGN PATENT DOCUMENTS

| JP | 2012-150409 | 8/2012 |
| JP | 2018-124271 | 8/2018 |
| JP | 2018-128663 | 8/2018 |
| JP | 2019-040066 | 3/2019 |
| JP | 2019-074361 | 5/2019 |
| JP | 2019-520595 | 7/2019 |
| WO | 2005/083493 | 9/2005 |
| WO | 2017/126386 | 7/2017 |
| WO | 2018/003852 | 1/2018 |

\* cited by examiner

OPTICAL DEVICE

BACKGROUND

1. Technical Field

The present disclosure relates to an optical device.

2. Description of the Related Art

There have conventionally been proposed various types of device that scan a scene with an optical beam, detect reflected light from a physical object included in the scene, and measures the distance to the physical object (see, for example, Japanese Unexamined Patent Application Publication No. 2018-128663 and U.S. Patent Application Publication No. 2018/0224709).

SUMMARY

One non-limiting and exemplary embodiment provides an optical device that is capable of comparatively easily changing the extent of spread of an optical beam.

In one general aspect, the techniques disclosed here feature an optical device including an optical deflector that emits, through a light exit surface parallel to a first direction and a second direction intersecting the first direction and in a direction intersecting the light exit surface, an optical beam having a shape extending in the second direction and that is capable of causing a direction of emission of the optical beam to change along the first direction and an optical element, placed on a path of the optical beam, that expands an extent of spread of the optical beam in the second direction.

The techniques disclosed here make it possible to achieve an optical device that is capable of comparatively easily changing the extent of spread of an optical beam.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Prior to a description of embodiments of the present disclosure, the underlying knowledge forming the basis of the present disclosure is described.

Figure 1A:
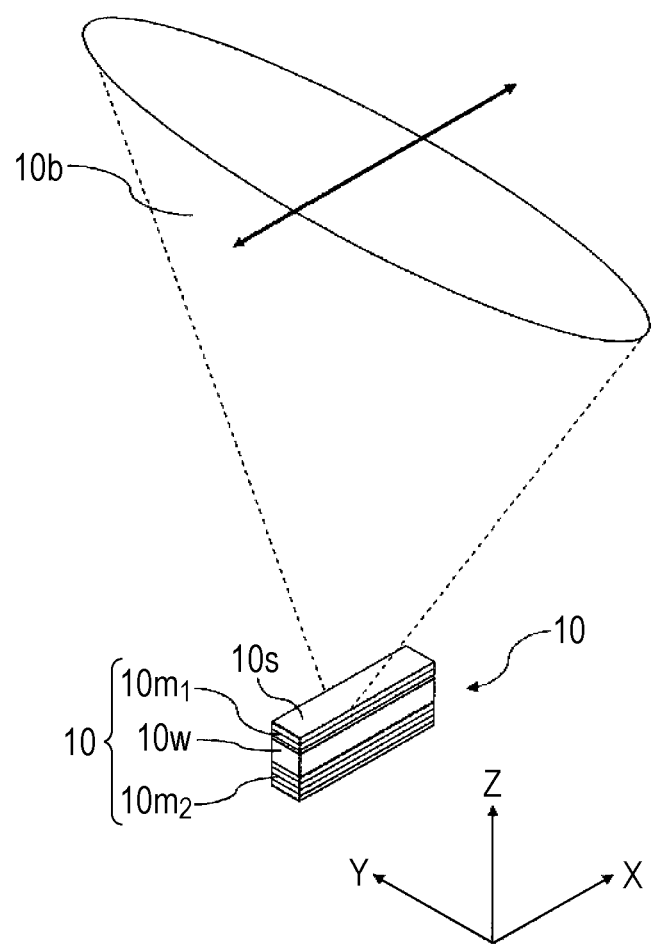
FIG. 1A is a perspective view schematically showing an example of an optical deflector.
Figure 1B:
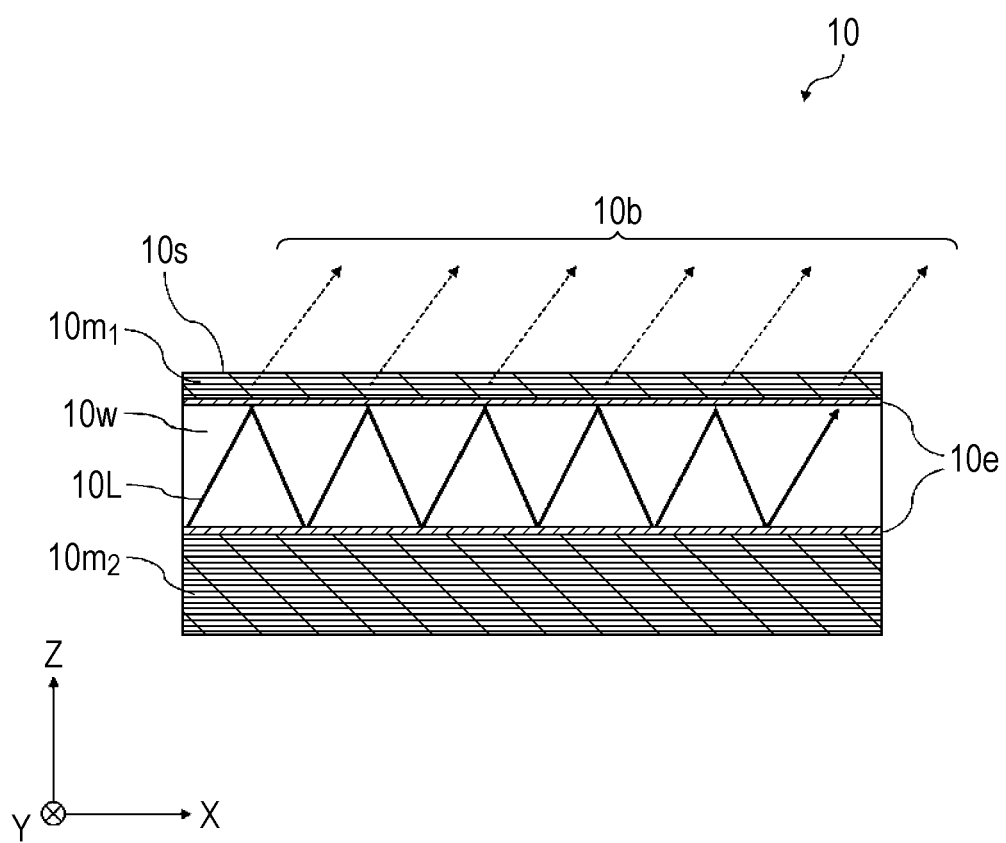
FIG. 1B is a diagram of the configuration shown in FIG. 1A as seen along a +Y direction.

FIG. 1A is a perspective view schematically showing an example of a structure of an optical deflector 10 according to an exemplary embodiment. FIG. 1B is a diagram of the configuration shown in FIG. 1A as seen along a +Y direction. X, Y, and Z axes orthogonal to one another are schematically shown for reference. It is assumed herein that the direction in which the arrow of an axis is facing is a + direction and the opposite direction is a – direction. It is assumed that a +Z direction points upward and –Z direction points downward. Note, however, that these designations are merely used for convenience of explanation and do not limit the attitude that the optical deflector 10 takes when actually used. Note also that the shape and size of the whole or part of a structure shown in a drawing are not intended to restrict the actual shape and size.

The optical deflector 10 emits, in a predetermined direction, an optical beam emitted by a light source (not illustrated). The optical deflector 10 includes a first mirror $10m_1$, a second mirror $10m_2$, and an optical waveguide layer $10w$. The first mirror $10m_1$ and the second mirror $10m_2$ face each other and extend in an X direction. The transmissivity of the first mirror $10m_1$ is higher than the transmissivity of the second mirror $10m_2$. At least either the first mirror $10m_1$ or the second mirror $10m_2$ may be formed, for example, from a multilayer reflecting film in which a plurality of high-refractive-index layers and a plurality of low-refractive-index layers are alternately stacked. The first mirror $10m_1$ and the second mirror $10m_2$ may be formed from multilayer reflecting films having the same high-refractive-index layers and the same low-refractive-index layers. In this case, when the number of layers that are stacked in the first mirror $10m_1$ is made smaller than the number of layers that are staked in the second mirror $10m_2$, the transmissivity of the first mirror $10m_1$ becomes higher than the transmissivity of the second mirror $10m_2$. The optical waveguide layer $10w$ is located between the first mirror $10m_1$ and the second mirror $10m_2$.

The first mirror $10m_1$ has a light exit surface $10s$ that is opposite to a side of the first mirror $10m_1$ that faces the optical waveguide layer $10w$ and that is parallel to an X-Y plane. Light $10L$ propagates along the X direction through the optical waveguide layer $10w$ while being reflected by the first mirror $10m_1$ and the second mirror $10m_2$. In so doing, a portion of the light $10L$ is emitted outward as an optical beam $10b$ from the light exit surface $10s$. The direction of the central axis of the optical beam $10b$ depends on the refractive index and/or thickness of the optical waveguide layer $10w$. The direction of the central axis of the optical beam $10b$ is herein referred to simply as "direction of emission of the optical beam $10b$".

The optical waveguide layer $10w$ may be configured such that there are changes in the refractive index and/or thickness according to changes in driving voltage applied. In the example shown in FIG. 1B, the optical waveguide layer $10w$ contains a liquid crystal material, and the optical waveguide layer $10w$ may be provided with two electrodes $10e$ through which the driving voltage is applied. When the driving voltage changes upon input of a control signal from a control circuit (not illustrated), the refractive index of the optical waveguide layer $10w$ changes, so that the direction of emission of the optical beam $10b$ emitted from the light exit surface $10s$ changes along the X direction. In another example, the optical waveguide layer $10w$ contains a gas or a liquid, and an actuator that deforms upon application of the driving voltage may be attached to the first mirror $10m_1$ and/or the second mirror $10m_2$. When the driving voltage changes upon input of a control signal from a control circuit (not illustrated), the thickness of the optical waveguide layer $10w$ changes along with a change in mirror spacing due to the deformation of the actuator, so that the direction of emission of the optical beam $10b$ emitted from the light exit surface $10s$ changes along the X direction. As noted above, in response to a control signal from an outside source, the optical deflector 10 allows the direction of emission of the optical beam $10b$ emitted from the light exit surface $10s$ to change along the X direction. The thick line parallel to the X direction of FIG. 1A represents a scanning direction of the optical beam $10b$.

Details such as the principle of operation and method of operation of the optical deflector 10 are disclosed in U.S. Patent Application Publication No. 2018/0224709, the entire contents of which are hereby incorporated by reference.

Next, the shape of the optical beam $10b$ is described. The shape of the optical beam $10b$ means the shape of an optical spot that, in a case where it is assumed that a screen perpendicular to the direction of emission of the optical beam $10b$ is present in a far field, is obtained by illuminating the screen with the optical beam $10b$. As shown in FIG. 1A, the optical beam $10b$ emitted from the light exit surface $10s$, which extends along the X direction, has such a shape in the far field as to extend along a Y direction like a line shape or an elliptical shape. As shown in FIG. 1A, the spread angle of the optical beam $10b$ in the Y direction is larger than the spread angle of the optical beam $10b$ in the X direction.

In a case where the optical deflector 10 is utilized in a LiDAR (Light Detecting And Ranging) system that measures the distance to a physical object with light, the extent of spread of the optical beam $10b$ in the Y direction is appropriately adjusted according to the purpose for which the LiDAR system is used. In a case where the LiDAR system is applied to a movable body such as an automobile, the distance to a physical object at a short distance can be measured with fewer acts of scanning by causing an optical beam extending along the horizontal to a road to change along the perpendicular to the road. Meanwhile, the distance to a physical object at a long distance can be measured by increasing the irradiation energy of the optical beam $10b$ per unit area by making the extent of spread of the optical beam $10b$ along the horizontal to the road relatively small.

The extent of spread in the Y direction of the optical beam $10b$ emitted from the optical deflector 10 is determined by the structure of the optical deflector 10, specifically the width of the light exit surface $10s$ in the Y direction. The narrower the width of the light exit surface $10s$ in the Y direction is, the larger the spread of the optical beam $10b$ in the Y direction becomes. The greater the width of the light exit surface $10s$ in the Y direction is, the smaller the spread of the optical beam $10b$ in the Y direction becomes. Note, however, that the spread of the optical beam $10b$ cannot be greatly changed solely by structure design.

In an optical device according to an embodiment of the present disclosure, by placing an optical element on a path of the optical beam $10b$ emitted from the optical deflector 10, the extent of spread of the optical beam $10b$ in the Y direction can be greatly changed.

An optical device according to a first item includes an optical deflector that emits, through a light exit surface parallel to a first direction and a second direction intersecting the first direction and in a direction intersecting the light exit surface, an optical beam having a shape extending in the second direction and that is capable of causing a direction of emission of the optical beam to change along the first direction and an optical element, placed on a path of the optical beam, that expands an extent of spread of the optical beam in the second direction.

In this optical device, an optical beam whose extent of spread is expanded makes it possible to scan a wider region with fewer acts of scanning.

An optical device according to a second item is directed to the optical device according to the first item, wherein the optical element includes at least one lens having a curvature in the second direction.

In this optical device, as a result of passage through the lens of the optical beam emitted from the optical element, the extent of spread of the optical beam is changed.

An optical device according to a third item is directed to the optical device according to the second item, wherein the lens is a concave lens.

In this optical device, the concave lens makes it possible to expand the extent of spread of the optical beam emitted from the optical element.

An optical device according to a fourth item is directed to the optical device according to the second item, wherein the lens is a convex lens.

In this optical device, the convex lens makes it possible to expand or reduce the extent of spread of the optical beam emitted from the optical element.

An optical device according to a fifth item is directed to the optical device according to any of the second to fourth items, wherein the optical element has a portion in which the curvature of the lens changes along the first direction.

In this optical device, variations in the spread of the optical beam emitted from the optical element can be reduced even if the angle of emission of the optical beam changes.

An optical device according to a sixth item is directed to the optical device according to any of the first to fifth items, wherein the optical element is in contact with the light exit surface of the optical deflector.

In this optical device, the overall size can be reduced by bringing the optical element into contact with the light exit surface of the optical deflector.

An optical device according to a seventh item is directed to the optical device according to the first item, wherein the optical element includes at least one mirror having a curvature in the second direction. The mirror reflects the optical beam emitted from the light exit surface of the optical deflector.

In this optical device, as a result of reflection by the mirror of the optical beam emitted from the optical element, the extent of spread of the optical beam is changed.

An optical device according to an eighth item is directed to the optical device according to the seventh item, wherein the mirror is a convex mirror.

In this optical device, the convex mirror makes it possible to expand the extent of spread of the optical beam emitted from the optical element.

An optical device according to a ninth item is directed to the optical device according to the seventh item, wherein the mirror is a concave mirror.

In this optical device, the concave mirror makes it possible to expand or reduce the extent of spread of the optical beam emitted from the optical element.

An optical device according to a tenth item is directed to the optical device according to any of the seventh to ninth items, wherein the optical element has a portion in which the curvature of the mirror changes along the first direction.

In this optical device, variations in the spread of the optical beam emitted from the optical element can be reduced even if the angle of emission of the optical beam changes.

An optical device according to an eleventh item is directed to the optical device according to any of the first to tenth items, wherein the optical deflector includes a first mirror and a second mirror that face each other and that extend in the first direction, and an optical waveguide layer, located between the first mirror and the second mirror, that guides light in the first direction.

In this optical device, a portion of light propagating through the optical waveguide layer is emitted outward.

An optical device according to a twelfth item is directed to the optical device according to any of the first to tenth items, wherein the optical deflector includes a plurality of optical waveguides, arranged along the first direction, that extend along the second direction, and a plurality of phase shifters connected separately to each of the plurality of optical waveguides.

In this optical device, a portion of light having entered the plurality of optical waveguides through the plurality of phase shifters is emitted outward.

An optical device according to a thirteenth item is directed to the optical device according to the twelfth item, wherein each of the plurality of optical waveguides is provided with a grating. The optical beam is emitted via the grating.

In this optical device, an optical beam formed by an overlap between a plurality of diffraction rays is emitted via the grating.

An optical device according to a fourteenth item includes an optical deflector that emits, through a light exit surface parallel to a first direction and a second direction intersecting the first direction and in a direction intersecting the light exit surface, an optical beam having a shape extending in the second direction and that is capable of causing a direction of emission of the optical beam to change along the first direction and an optical element, placed on a path of the optical beam, that changes an extent of spread of the optical beam in the second direction. The optical element has a first surface on which the optical beam falls and a second surface through which the optical beam exits. A distance between the light exit surface and the first or second surface of the optical element along a direction perpendicular to the light exit surface changes along the first direction.

In this optical device, variations in the shape and intensity distribution of the optical beam entailed by beam scanning can be reduced.

An optical device according to a fifteenth item is directed to the optical device according to the fourteenth item, wherein the optical element includes at least one lens having a curvature in the second direction and has a portion in which the curvature of the lens changes along the first direction.

In this optical device, even if the curvature of the lens with respect to the optical beam is not strictly constant regardless of the angle of emission, variations in the shape and intensity distribution of the optical beam due to change of the angle of emission can be reduced.

An optical device according to a sixteenth item is directed to the optical device according to the fourteenth item, wherein the optical element includes at least one lens having a curvature in the second direction and has a portion in which the curvature of the lens is constant along the first direction. The first or second surface of the optical element in the portion is inclined along the first direction with respect to the light exit surface.

This optical device can reduce the variation in optical path length, which depends on the angle of emission, while holding the curvature of the lens constant along the first direction. This results in making it possible to reduce the variations in the shape and intensity distribution of the optical beam entailed by beam scanning.

In the present disclosure, all or some of the circuits, units, apparatuses, members, or sections or all or some of the functional blocks in the block diagrams may be implemented as one or more of electronic circuits including, but not limited to, a semiconductor device, a semiconductor integrated circuit (IC), or an LSI (large scale integration). The LSI or IC can be integrated into one chip, or also can be a combination of multiple chips. For example, functional blocks other than a memory may be integrated into one chip. The name used here is LSI or IC, but it may also be called system LSI, VLSI (very large scale integration), or VLSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or some of the functions or operations of the circuits, units, apparatuses, members, or sections are implemented by executing software. In such a case, the software is recorded on one or more non-transitory recording media such as a ROM, an optical disk, or a hard disk drive, and when the software is executed by a processor, the software causes the processor together with peripheral devices to execute the functions specified in the software. A system or device may include such one or more non-transitory recording media on which the software is recorded and a processor together with necessary hardware devices such as an interface.

In the present disclosure, the term "light" means electromagnetic waves including ultraviolet radiation (ranging from approximately 10 nm to approximately 400 nm in wavelength) and infrared radiation (ranging from approximately 700 nm to approximately 1 mm in wavelength) as well as visible light (ranging approximately 400 nm to approximately 700 nm in wavelength).

The following describes more specific embodiments of the present disclosure. Note, however, that an unnecessarily detailed description may be omitted. For example, a detailed description of a matter that is already well known and a repeated description of substantially identical configurations may be omitted. This is intended to avoid unnecessary redundancy of the following description and facilitate understanding of persons skilled in the art. It should be noted that the inventors provide the accompanying drawings and the following description for persons skilled in the art to fully understand the present disclosure and do not intend to thereby limit the subject matter recited in the claims. In the following description, identical or similar constituent elements are given the same reference signs.

Embodiment 1

Figure 2:
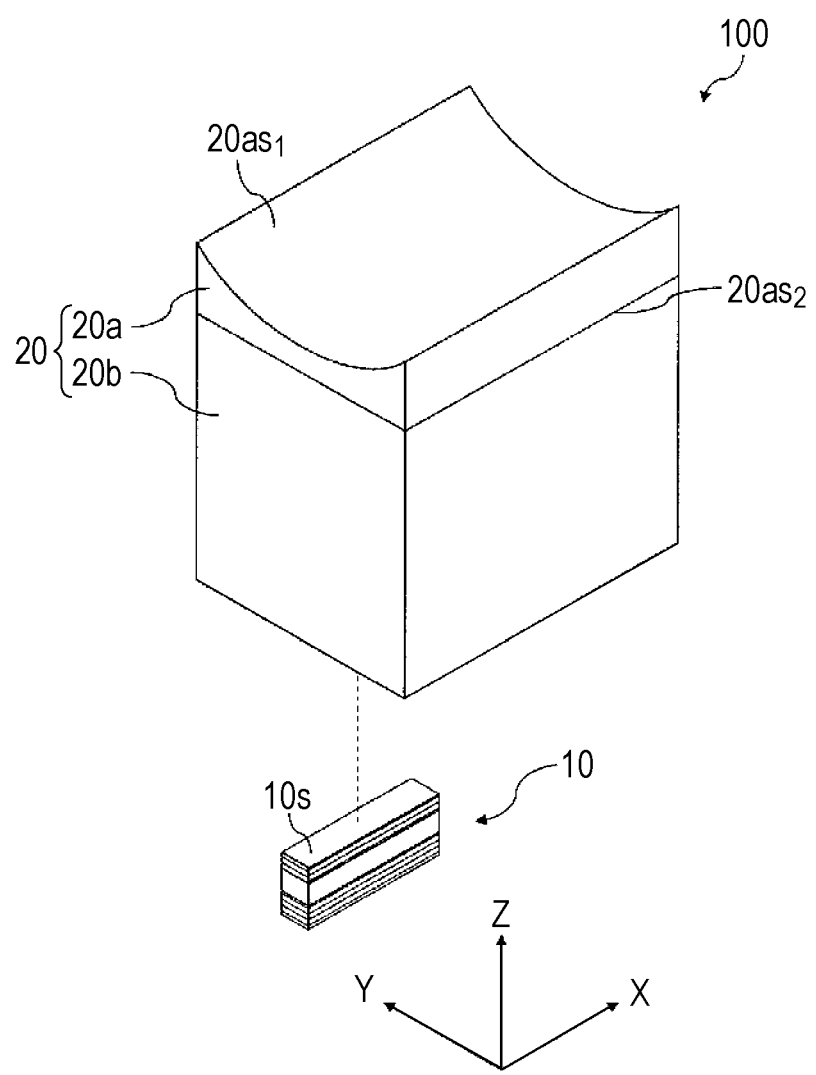
FIG. 2 is a perspective view schematically showing an example of an optical device according to Embodiment 1 of the present disclosure.

First, a basic example configuration of an optical device according to Embodiment 1 of the present disclosure is described with reference to FIG. 2. FIG. 2 is a perspective view schematically showing an example of an optical device 100 according to Embodiment 1 of the present disclosure. Although, for ease of comprehension of explanation, FIG. 2 shows constituent elements separate from each other, these constituent elements may be in contact with each other. The same applies to the following perspective views. The optical device 100 according to Embodiment 1 includes an optical deflector 10 and an optical element 20.

The optical deflector 10 according to Embodiment 1 is as described with reference to FIGS. 1A and 1B. The aforementioned light source may include, for example, a semiconductor laser element. The wavelength of an optical beam emitted by the light source may be selected depending on the intended use. In a case where the distance to a physical objected is measured by infrared radiation, the wavelength of the optical beam may for example be longer than or equal to 700 nm and shorter than or equal to 2.5 μm. The wavelength of the optical beam may fall within a visible range of wavelengths, i.e. longer than or equal to approximately 400 nm and shorter than or equal to approximately 700 nm. The wavelength of the optical beam may be longer than or equal to 2.5 μm.

The optical element 20 according to Embodiment 1 includes a lens 20a and a medium 20b supporting the lens 20a. The optical element 20 is placed on the path of the optical beam 10b emitted from the optical deflector 10. The lens 20a is a plano-concave lens having an upper surface $20as_1$ and a lower surface $20as_2$. FIG. 2 shows the curvature of the lens 20a with exaggeration. The lens 20a is configured such that the upper surface $20as_1$ has a curvature in the Y direction and the lower surface $20as_2$ is a flat bottom surface. The curvature is defined by the reciprocal of the radius of curvature. The lens 20a is a cylindrical lens having a structure extending in the X direction. The lens 20a is configured such that at least either the upper surface $20as_1$ or the lower surface $20as_2$ has a curvature in the Y direction. The radius of curvature may for example be greater than or equal to 1 mm and less than or equal to 100 mm. The medium 20b has the same refractive index as the lens 20a, but may have a different refractive index. The medium 20b is in contact with the light exit surface 10s of the optical deflector 10. The medium 20b may not be in contact with the light exit surface 10s of the optical deflector 10, depending on the intended use. The medium 20b may be air, water, or a vacuum. The optical element 20 does not need to include both the lens 20a and the medium 20b, but may include only at least either of them. The length of the optical element 20 in the X direction may for example be greater than or equal to 1 mm and less than or equal to 5 mm. The width of the optical element 20 in the Y direction may for example be greater than or equal to 1 mm and less than or equal to 10 mm. The height of the optical element 20 in a Z direction may for example be greater than or equal to 1 mm and less than or equal to 10 mm.

Figure 3A:
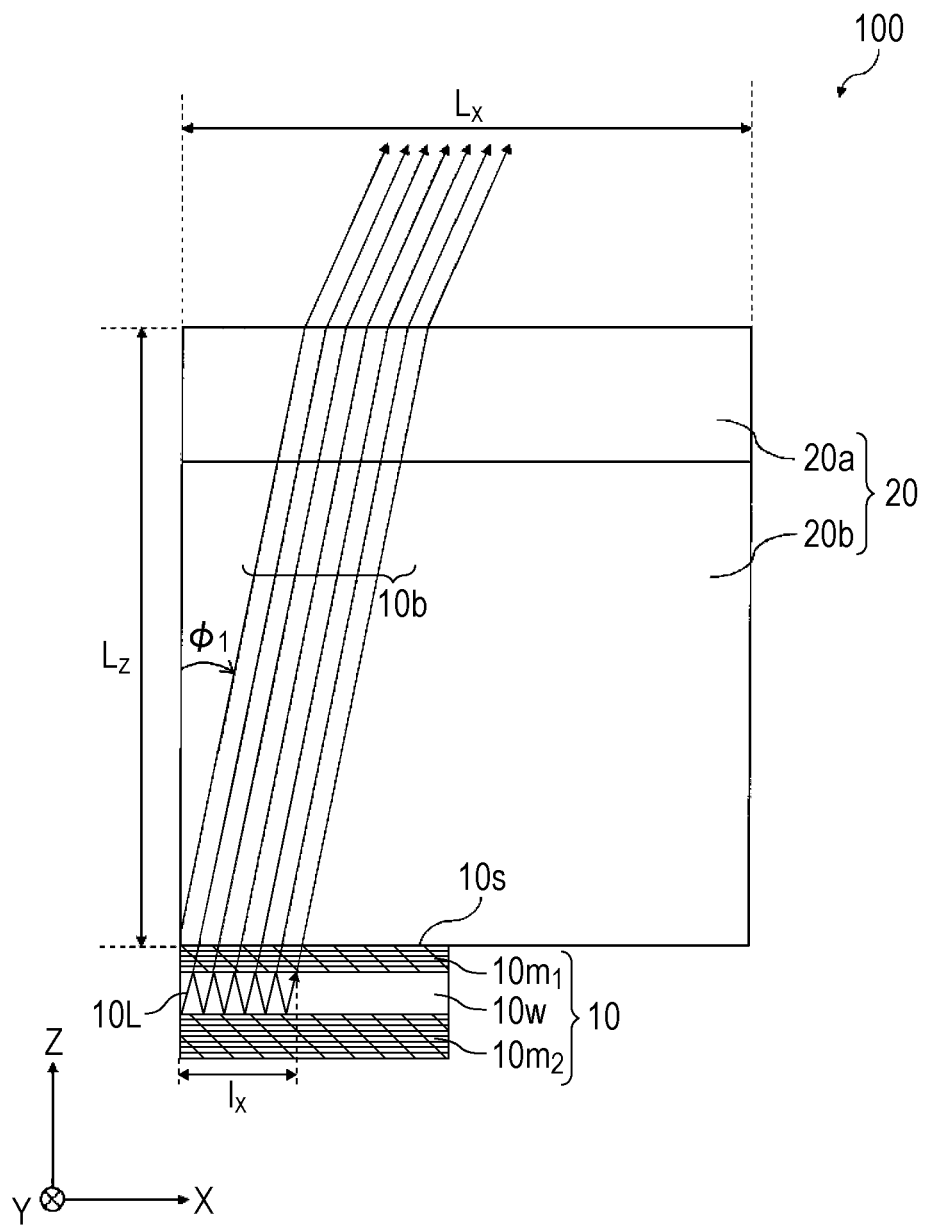
FIG. 3A is a diagram of the configuration shown in FIG. 2 as seen along the +Y direction.
Figure 3B:
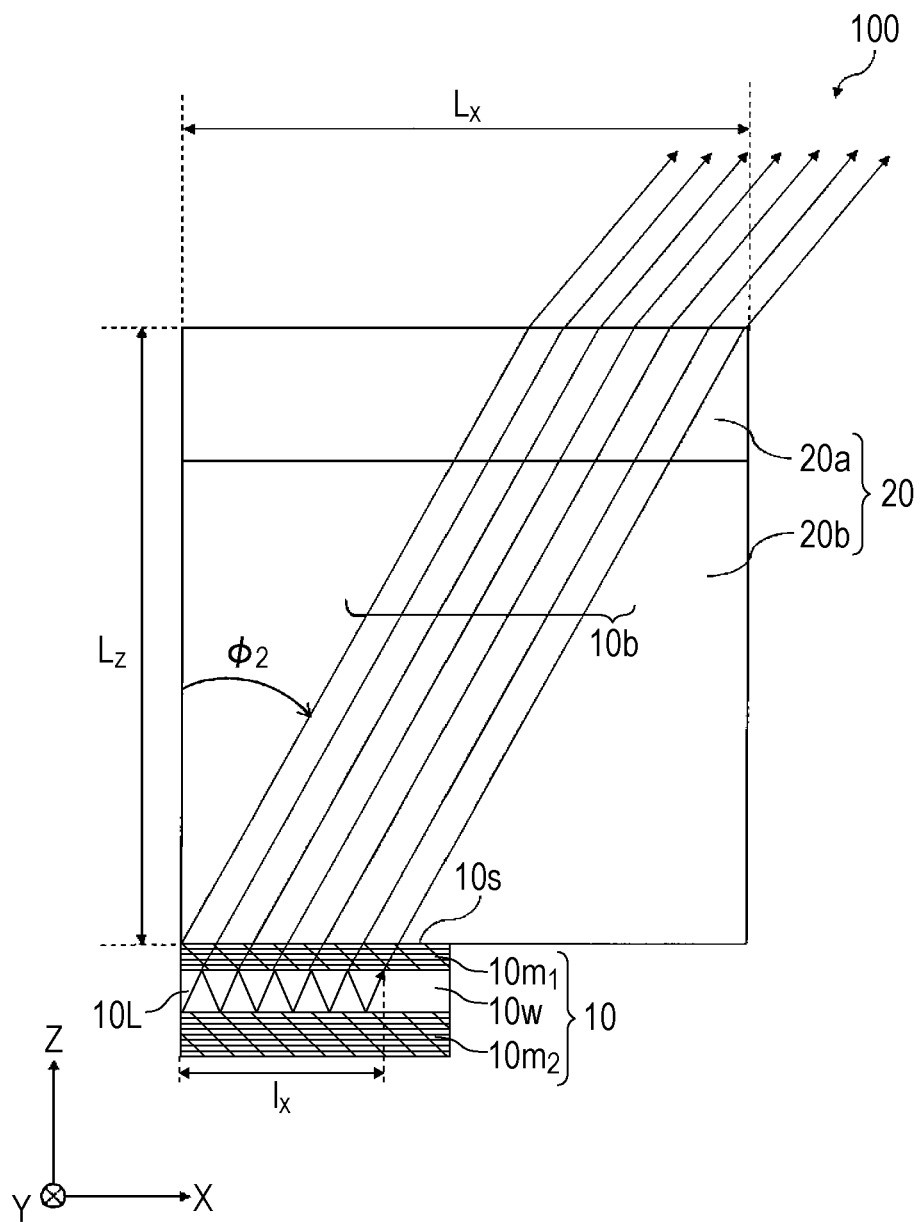
FIG. 3B is a diagram of the configuration shown in FIG. 2 as seen along the +Y direction.

Next, changes in the direction of emission of the optical beam 10b emitted from the light exit surface 10s of the optical deflector 10 are described with reference to FIGS. 3A and 3B. FIGS. 3A and 3B are diagrams of the configuration shown in FIG. 2 as seen along the +Y direction. In the examples shown in FIGS. 3A and 3B, the optical deflector 10 and the optical element 20 are arranged so as to have their surfaces aligned when seen along a +X direction. Changing the refractive index and/or thickness of the optical waveguide layer 10w causes the direction of emission of the optical beam 10b to change along the X direction. In the examples shown in FIGS. 3A and 3B, the angle of emission of the optical beam 10b varies from $\varphi_1$ to $\varphi_2$. The angle of emission of the optical beam 10b is equivalent to an angle formed by a plane parallel to a Y-Z plane and the optical beam 10b. $\varphi_1$ and $\varphi_2$ both have positive values. As shown in FIGS. 3A and 3B, the intensity of the light 10L, which propagates through the optical waveguide layer 10w, decreases along the X direction, as a portion of the light 10L is emitted from the light exit surface 10s. Let it be assumed that the distance at which the intensity of the light 10L is reduced to 1/e is a propagation length $l_x$. e is a base of natural logarithm. The length $L_x$ of the optical element 20 in the X direction is designed to be longer than the propagation length $l_x$ so that all of the optical beam 10*b* having passed through the optical element 20 is efficiently emitted outward from the upper surface 20*as*$_1$ of the lens 20*a* of the optical element 20. Specifically, the length $L_x$ of the optical element 20 is designed according to the propagation length $l_x$, the maximum angle of emission $\varphi_2$ of the optical beam 10*b*, and the height $L_z$ of the optical element 20 in the Z direction. The optical beam 10*b* is refracted by the upper surface 20*as*$_1$ of the lens 20*a* and emitted outward.

Figure 4:
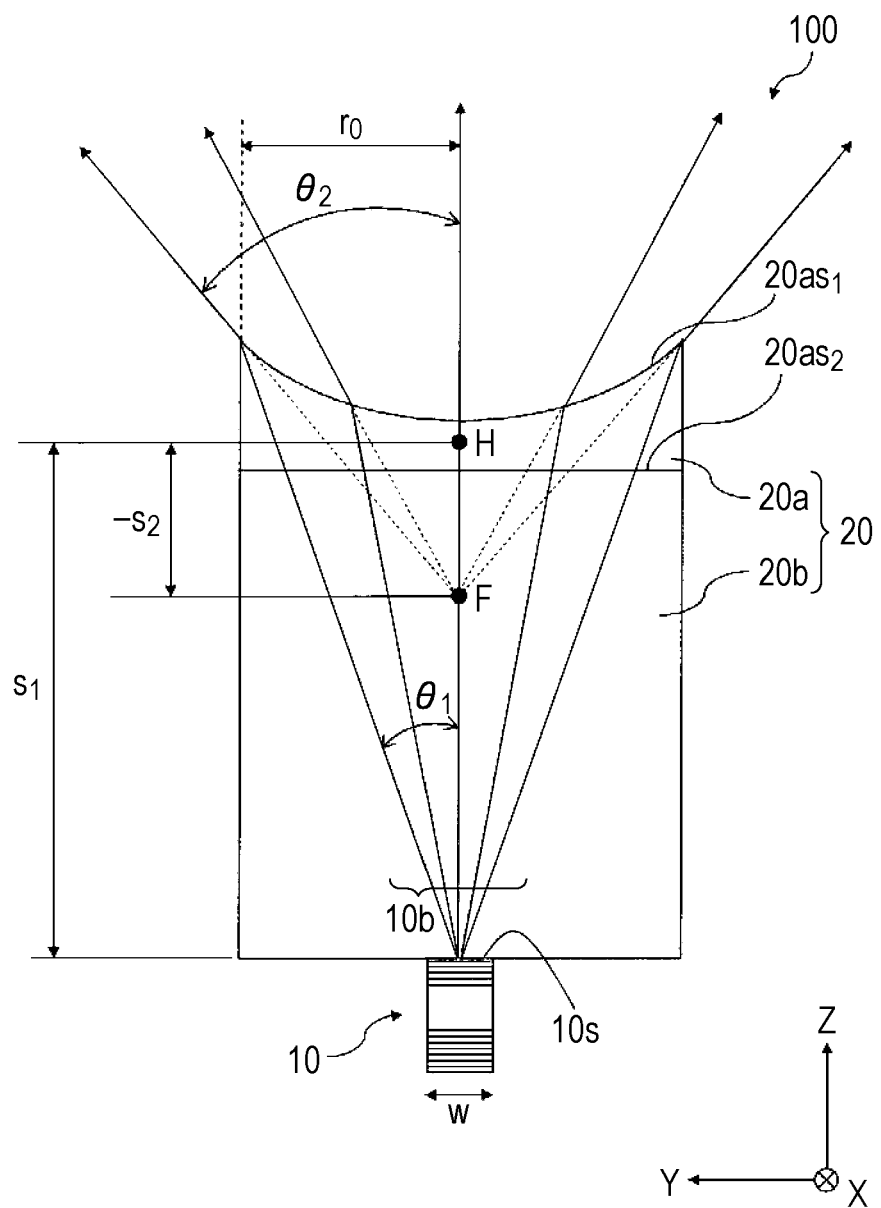
FIG. 4 is a diagram of the configuration shown in FIG. 2 as seen along a +X direction.

Next, the extent of spread in the Y direction of the optical beam 10*b* having passed through the optical element 20 is described with reference to FIG. 4. FIG. 4 is a diagram of the configuration shown in FIG. 2 as seen along the +X direction. The arrowed rays of light represent how the optical beam 10*b* emitted from the optical deflector 10 propagates. The optical element 20 uses the effect of refraction to cause light incident on the optical element 20 to be emitted in a direction different from the direction from which the light is incident. The effect of diffraction may be used instead of the effect of refraction, or both the effect of refraction and the effect of diffraction may be used. Microscopically, the optical beam 10*b* is emitted from the light exit surface 10*s*, which has a width in the Y direction; however, for ease of comprehension of explanation, the optical beam 10*b* is described as being emitted from one point.

The following describes how the optical element 20 is structured. Let it be assumed that n is the refractive indices of the lens 20*a* and the medium 20*b*. Let it also be assumed that $\theta_1$ is a half angle representing the spread angle of the optical beam 10*b*, emitted from the light exit surface 10*s*, which propagates through the medium 20*b*. Let it also be assumed that $\theta_2$ is a half angle representing the spread angle of the optical beam 10*b* emitted outward from the lens 20*a*. Let it be also assumed that w is the width of the optical deflector 10. The width of the optical deflector 10 is equal to the width of the light exit surface 10*s*. Let it be assumed that $r_0$ is the half width of the lens 20*a* in the Y direction and f is the focal length of the lens 20*a* as seen along the direction of emission of the beam 10*b*. Let it be also assumed that $s_1$ is the distance between the principal point H of the lens 20*a* and the focal point F of rays of light propagating through the medium 20*b*. Let it be also assumed that $-s_2$ is the distance between the principal point H of the lens 20*a* and the focal point F of rays of light that are emitted outward. The principal point H is a principal point with the direction of emission of the optical beam 10*b* in the optical element 20 being an optical axis, and $s_1$ and $-s_2$ are distances along the direction of emission of the optical beam 10*b* within the optical element 20.

First, the spread angle $\theta_1$ of the optical beam 10*b* emitted from the light exit surface 10*s* is described. Let it be assumed that an intensity distribution in the Y direction of the optical beam 10*b* emitted from the light exit surface 10*s* exhibits a quasi-rectangular shape in a near field and the width of the shape is the width w of the optical deflector 10. Assuming that $\lambda$ is the wavelength of the optical beam 10*b*, light intensity I at a place distant by y along the Y direction from the center of the optical deflector 10 and distant by z along the Z direction from the light exit surface 10*s* is expressed by Formula (1) as follows:

$$I = \operatorname{sinc}^2\left(\pi \frac{yw}{z\lambda}\right) \quad (1)$$

A distribution of the light intensity I in the Y direction has a central peak called "main lobe" and a plurality of small peaks on both sides of the main lobe. Assuming that the width of the optical beam 10*b* is the width of the main lobe, the half width of this main lobe is expressed by Formula (2) as follows:

$$\frac{yw}{z\lambda} = 1 \quad (2)$$

The spread angle $\theta_1$ of the optical beam 10*b* is expressed by Formula (3) as follows:

$$\tan\theta_1 = \frac{y}{z} \quad (3)$$

From Formulas (2) and (3), the spread angle $\theta_1$ is expressed by Formula (4) as follows:

$$\theta_1 = \tan^{-1}\left(\frac{\lambda}{w}\right) \quad (4)$$

In a case where the spread angle $\theta_1$ is sufficiently small, the spread angle $\theta_1$ is approximately expressed by Formula (5) as follows:

$$\theta_1 \approx \frac{\lambda}{w} \quad (5)$$

From Formula (4) or (5), it is found that in a case where the wavelength $\lambda$ is constant, the spread angle $\theta_1$ increases as w decreases, and decreases as w increases.

Next, the spread angle $\theta_2$ of the optical beam 10*b* emitted outward from the optical element 20 is described. In the example shown in FIG. 4, in actuality, the curvature of the lens 20*a* is gentle, and the distance between the upper surface 20*as*$_1$ and the lower surface 20*as*$_2$ of the lens 20*a* is relatively short in comparison with the distance $s_1$.

When the optical beam 10*b* of the spread angle $\theta_1$ falls on the lens 20*a* with a radius r, the distance $s_1$ is approximately expressed by Formula (6) as follows:

$$s_1 \approx \frac{r}{\tan\theta_1} \quad (6)$$

Note here that the distance $s_1$ and the distance $s_2$ satisfy Formula (7) as follows:

$$s_2 - f = \frac{f^2}{s_1 - f} \quad (7)$$

Transforming Formula (7) causes the distance $s_2$ to be expressed by Formula (8) as follows:

$$s_2 = \frac{s_1 f}{s_1 - f} = \frac{rf}{r - f\tan\theta_1} \quad (8)$$

Accordingly, the spread angle $\theta_2$ of the optical beam 10b is approximately expressed by Formula (9) as follows:

$$\theta_2 \approx \tan^{-1}\left(\frac{r}{-s_2}\right) = \tan^{-1}\left(\tan\theta_1 - \frac{r}{f}\right) \quad (9)$$

In a case where the lens 20a is a plano-concave lens, the spread angle $\theta_2$ increases as the absolute value of the focal length f decreases and r increases, as the focal distance f is expressed by a negative value. Assuming here that the lens 20a is a lens having a plano-concave shape at least in the Y direction and R is the radius of curvature of the plano-concave lens, the focal length f is expressed by Formula (10) as follows:

$$f = -\frac{R}{n-1} \quad (10)$$

Substituting Formula (10) into Formula (9) causes the spread angle $\theta_2$ to be expressed by Formula (11) as follows:

$$\theta_2 \approx \tan^{-1}\left[\tan\theta_1 + \frac{r(n-1)}{R}\right] \quad (11)$$

From Formula (11), it is found that the spread angle $\theta_2$ increases as R decreases, and increases as r increases.

Figure 5A:
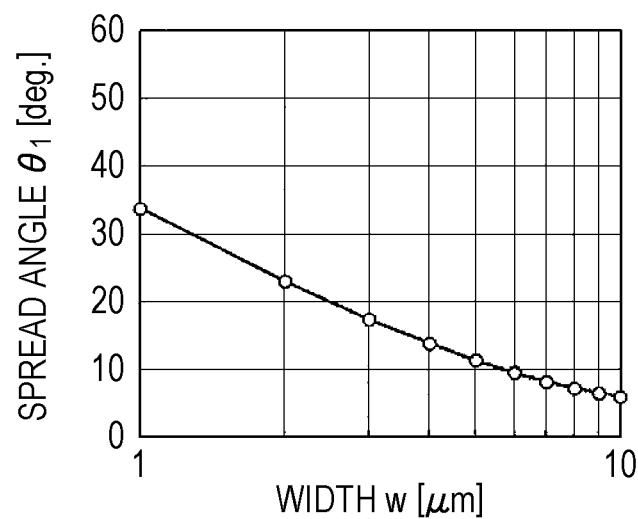
FIG. 5A is a plot showing results of calculation of a relationship between the width of the optical deflector and a spread angle of an optical beam in the absence of an optical element.
Figure 5B:
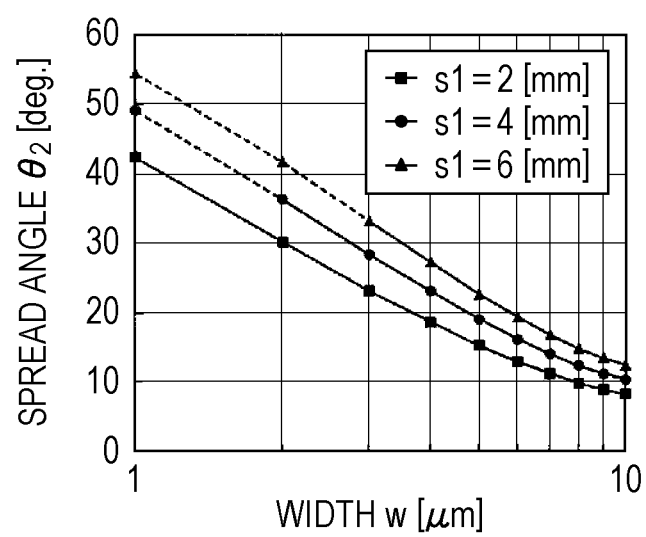
FIG. 5B is a plot showing results of calculation of a relationship between the width of the optical deflector and a spread angle of the optical beam in the presence of the optical element.

Next, the extent to which the spread angle $\theta_2$ of the optical beam 10b changes in comparison with the spread angle $\theta_1$ is described with reference to FIGS. 5A and 5B. FIG. 5A is a plot showing results of calculation of a relationship between the width w of the optical deflector 10 and the spread angle $\theta_1$ of the optical beam 10b in the absence of the optical element 20. FIG. 5B is a plot showing results of calculation of a relationship between the width w of the optical deflector 10 and the spread angle $\theta_2$ of the optical beam 10b in the presence of the optical element 20. In the examples shown in FIGS. 5A and 5B, the wavelength of the optical beam 10b is given as $\lambda=940$ nm, and the width w of the optical deflector 10 is greater than or equal to 1 μm and less than or equal to 10 μm.

The width w of the optical deflector 10 is designed within this range for the following reasons. Fabricating the optical deflector 10 with high processing accuracy so as to make the width w of the optical deflector 10 narrower than 1 μm drives up manufacturing cost. Further, the narrower the width w of the optical deflector 10 becomes, the more the light 10L, which propagates through the optical waveguide layer 10w, leaks outward in the Y direction. Great outward leakage causes a decrease in efficiency of propagation of the light 10 through the optical waveguide layer 10w, thus causing a decrease in the efficiency with which the optical beam 10b is emitted from the light exit surface 10s. Further, since great outward leakage too contributes to the optical beam 10b, the width of the light exit surface 10s in the Y direction substantially increases, so that the spread angle $\theta_1$ of the optical beam 10b cannot be made as large as it is expected to be. Meanwhile, making the width w of the optical deflector 10 greater than 10 μm expands the size of a chip that includes the optical deflector 10, thus driving up manufacturing cost.

In the example shown in FIG. 5A, the relationship between the width w of the optical deflector 10 and the spread angle $\theta_1$ of the optical beam 10b was calculated with the outward leakage of light from the optical waveguide layer 10w taken into consideration in addition to Formula (4). Designing the width w of the optical deflector 10 within the range of widths greater than or equal to 1 μm and less than or equal to 10 μm causes the spread angle $\theta_1$ of the optical beam 10b to be larger than or equal to 6 degrees and smaller than or equal to 34 degrees.

In the example shown in FIG. 5B, the relationship between the width w of the optical deflector 10 and the spread angle $\theta_2$ of the optical beam 10b was calculated with the outward leakage of light from the optical waveguide layer 10w taken into consideration in addition to Formulas (4), (6), and (11). The refractive index of the optical element 20 was given as $n=1.451$. The radius of curvature of the plano-concave lens was given as $R=2.5$ mm. The distance to the focal point F of rays of light propagating through the medium 20b was given as $s_1=2$ mm, 4 mm, or 6 mm. The dashed line portion shown in FIG. 5B represents spread angles $\theta_2$ that cannot be achieved with the radius r of the optical beam 10b exceeding the radius of curvature R of the lens 20a.

In the example shown in FIG. 5B, in a case where $s_1=2$ mm, designing the width w of the optical deflector 10 within the range of widths greater than or equal to 1 μm and less than or equal to 10 μm causes the spread angle $\theta_2$ of the optical beam 10b to be larger than or equal to 8 degrees and smaller than or equal to 42 degrees. In the example shown in FIG. 5A, with the width w falling within the same range, the spread angle $\theta_1$ of the optical beam 10b is larger than or equal to 6 degrees and smaller than or equal to 34 degrees.

Similarly, in the example shown in FIG. 5B, in a case where $s_1=4$ mm, designing the width w of the optical deflector 10 within the range of widths greater than or equal to 2 μm and less than or equal to 10 μm causes the spread angle $\theta_2$ of the optical beam 10b to be larger than or equal to 10 degrees and smaller than or equal to 36 degrees. In the example shown in FIG. 5A, with the width w falling within the same range, the spread angle $\theta_1$ of the optical beam 10b is larger than or equal to 6 degrees and smaller than or equal to 23 degrees.

Similarly, in the example shown in FIG. 5B, in a case where $s_1=6$ mm, designing the width w of the optical deflector 10 within the range of widths of greater than or equal to 3 μm and less than or equal to 10 μm causes the spread angle $\theta_2$ of the optical beam 10b to be larger than or equal to 12 degrees and smaller than or equal to 33 degrees. In the example shown in FIG. 5A, with the width w falling within the same range, the spread angle $\theta_1$ of the optical beam 10b is larger than or equal to 6 degrees and smaller than or equal to 17 degrees.

In any of the cases where $s_1=2$ mm, where $s_1=4$ mm, and where $s_1=6$ mm, the spread angle $\theta_2$ of the optical beam 10b in the presence of the optical element 20 is expanded in comparison with the spread angle $\theta_1$ of the optical beam 10b in the absence of the optical element 20. In this way, providing the optical element 20 on the optical deflector 10 makes it possible to increase the spread angle $\theta_2$ of the optical beam 10b without narrowing the width w of the optical deflector 10 with high processing accuracy. This optical beam 10b makes it possible to scan a wider region with fewer acts of scanning. The optical device 100 according to Embodiment 1 makes it possible to easily obtain an optical beam 10b having an extent of spread suitable for the intended use.

Modifications of Embodiment 1

Next, first to fifth modifications of the optical device 100 according to Embodiment 1 are described with reference to FIGS. 6A to 10B. The optical element 20 of the optical device 100 may include a lens other than the plano-concave lens 20a, shown in FIG. 2, which extends in the X direction.

Figure 6A:
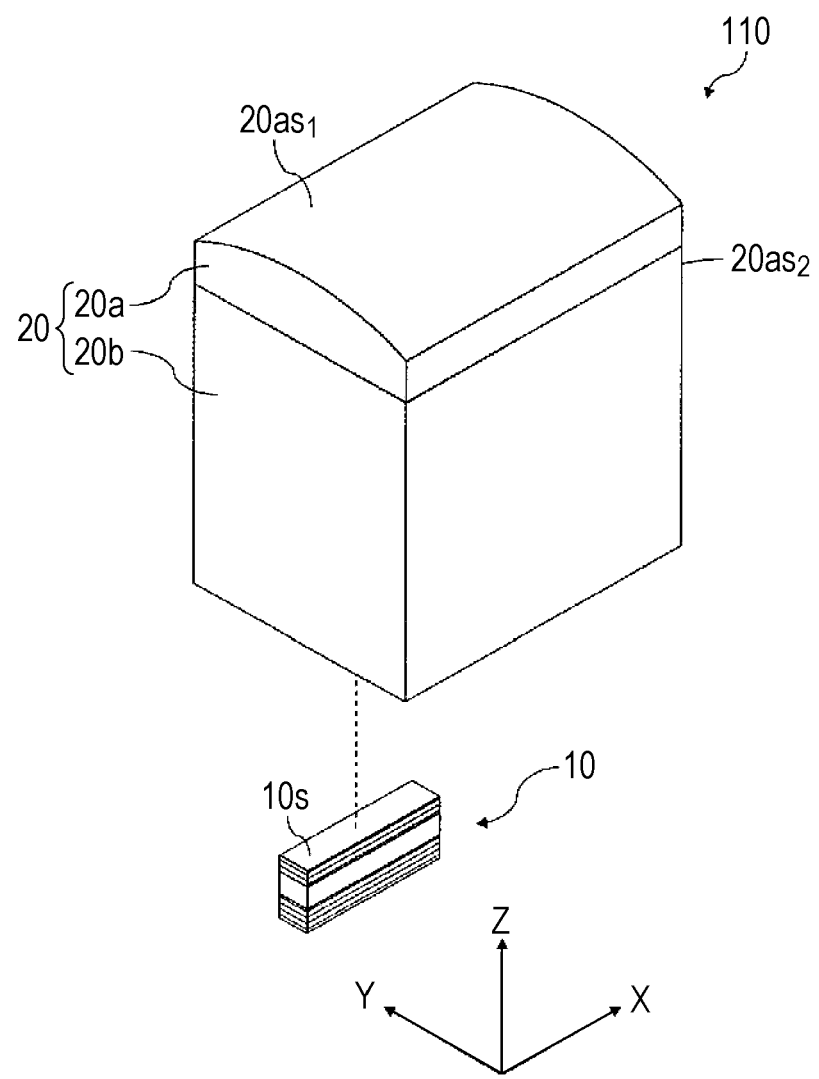
FIG. 6A is a perspective view schematically showing an example of an optical device according to a first modification of Embodiment 1.
Figure 6B:
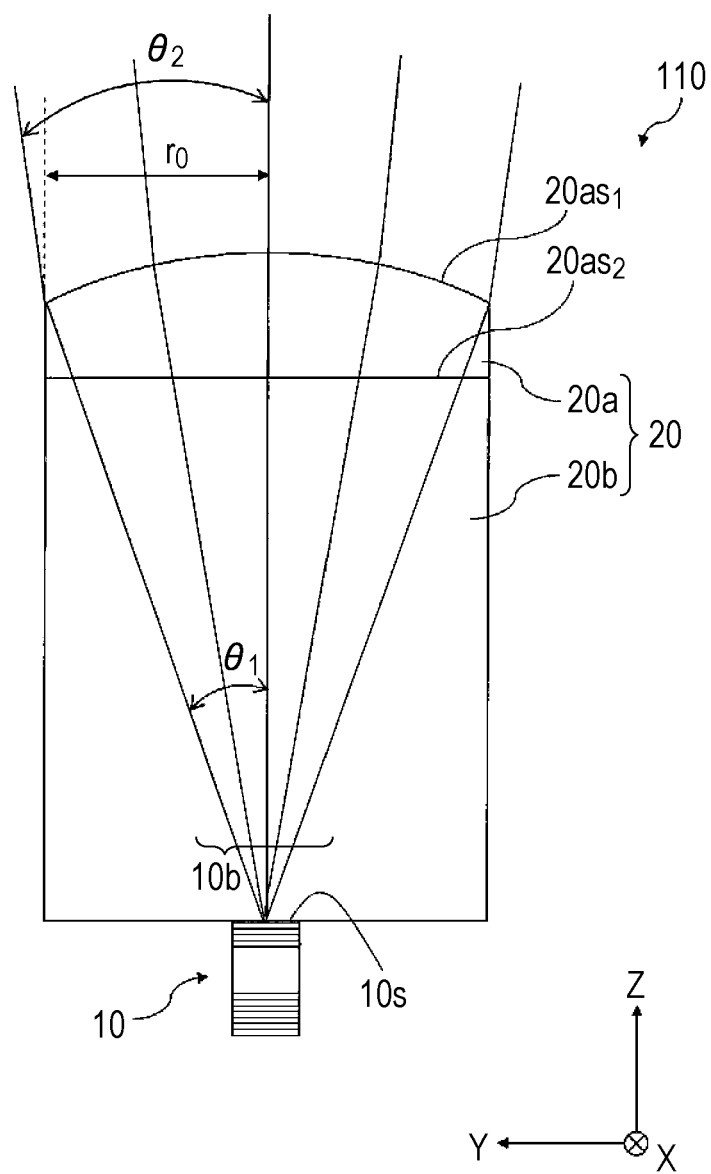
FIG. 6B is a diagram of the configuration shown in FIG. 6A as seen along the +X direction.

FIG. 6A is a perspective view schematically showing an example of an optical device 110 according to the first modification of Embodiment 1. FIG. 6B is a diagram of the configuration shown in FIG. 6A as seen along the +X direction. The optical device according to the first modification differs from the optical device 100 according to Embodiment 1 in that the lest 20a of the optical element 20 is a plano-convex lens. In the example shown in FIGS. 6A and 6B, the curvature of the plano-convex lens 20 in the Y direction is relatively small. In this case, unlike in the aforementioned example, the spread angle $\theta_2$ of the optical beam 10b decreases. Since the irradiation energy of the optical beam 10b per unit area increases, a physical object at a long distance can be scanned by this optical beam 10b.

Figure 7A:
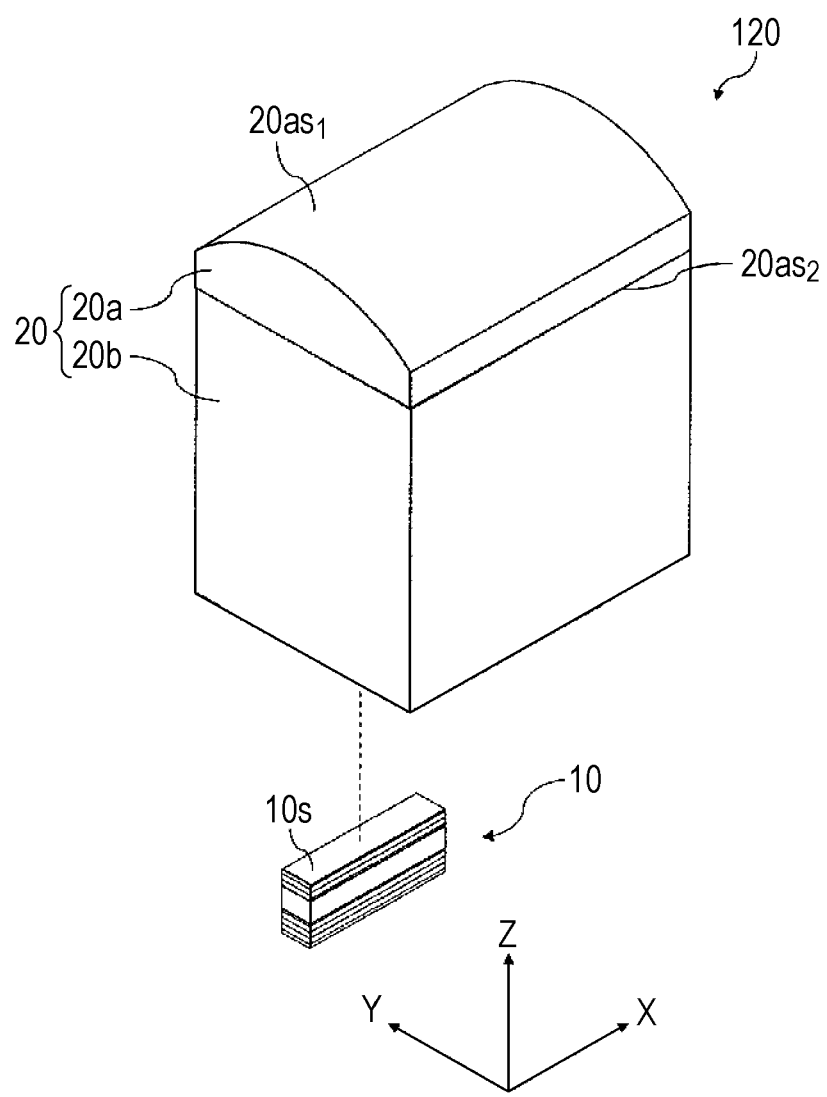
FIG. 7A is a perspective view schematically showing an example of an optical device according to a second modification of Embodiment 1.
Figure 7B:
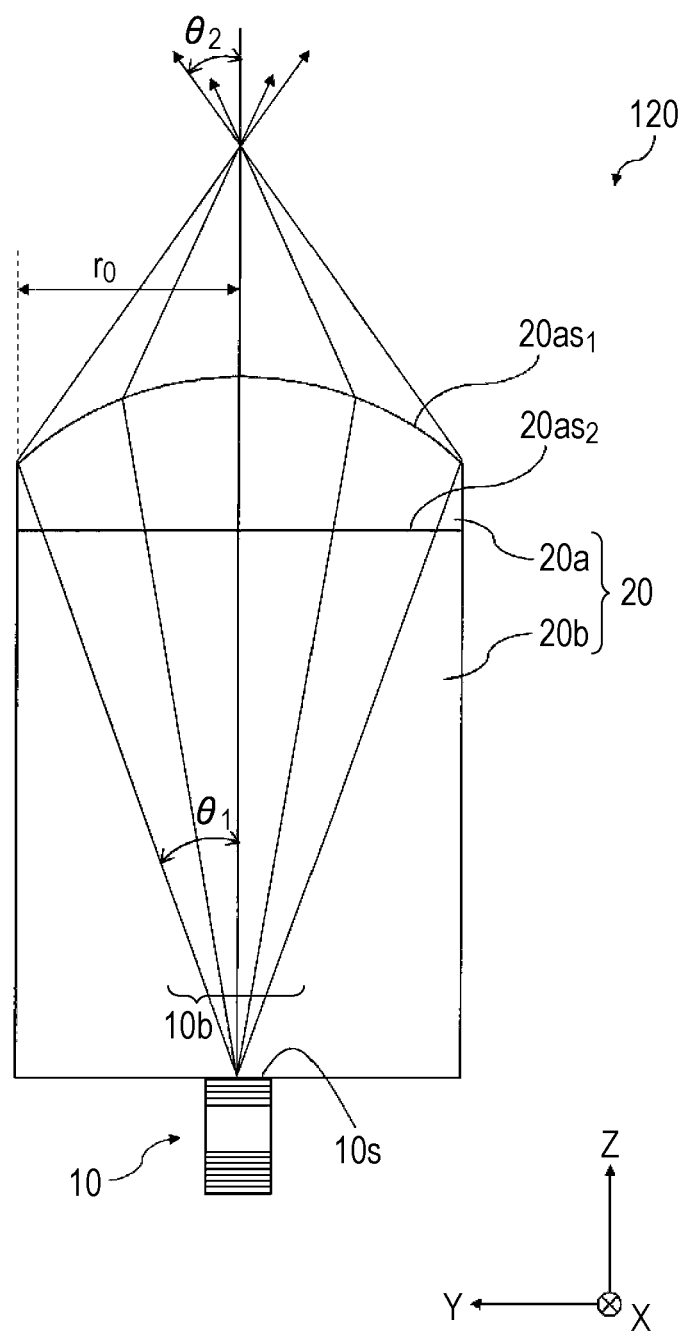
FIG. 7B is a diagram of the configuration shown in FIG. 7A as seen along the +X direction.

FIG. 7A is a perspective view schematically showing an example of an optical device 120 according to the second modification of Embodiment 1. FIG. 7B is a diagram of the configuration shown in FIG. 7A as seen along the +X direction. The optical device 120 according to the second modification differs from the optical device 110 according to the first modification in that the curvature of the convex lens 20a in the Y direction is relatively large. After having been emitted from the convex lens 20a, the optical beam 10b converges first and then diffuses. In this case, the spread angle $\theta_2$ of the optical beam 10b increases.

As shown in FIGS. 6B and 7B, the spread angle $\theta_2$ of the optical beam 10b can be expanded or reduced according to the curvature of the convex lens 20a.

Figure 8A:
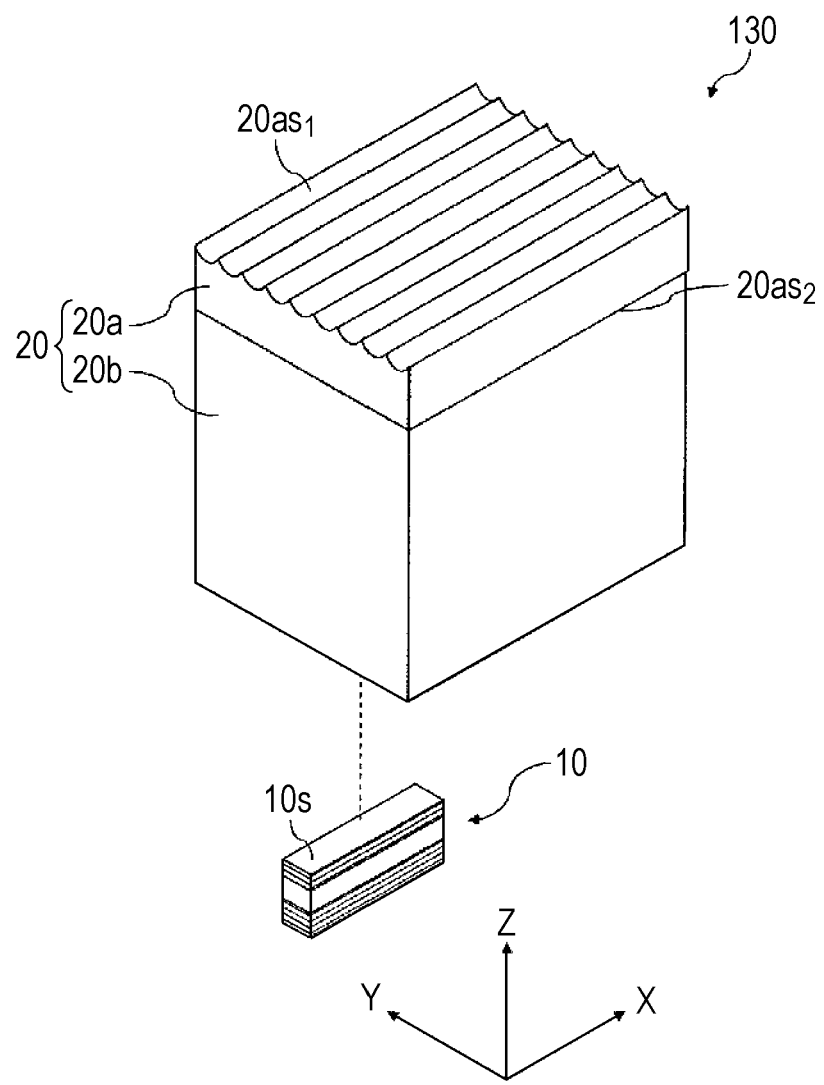
FIG. 8A is a perspective view schematically showing an example of an optical device according to a third modification of Embodiment 1.
Figure 8B:
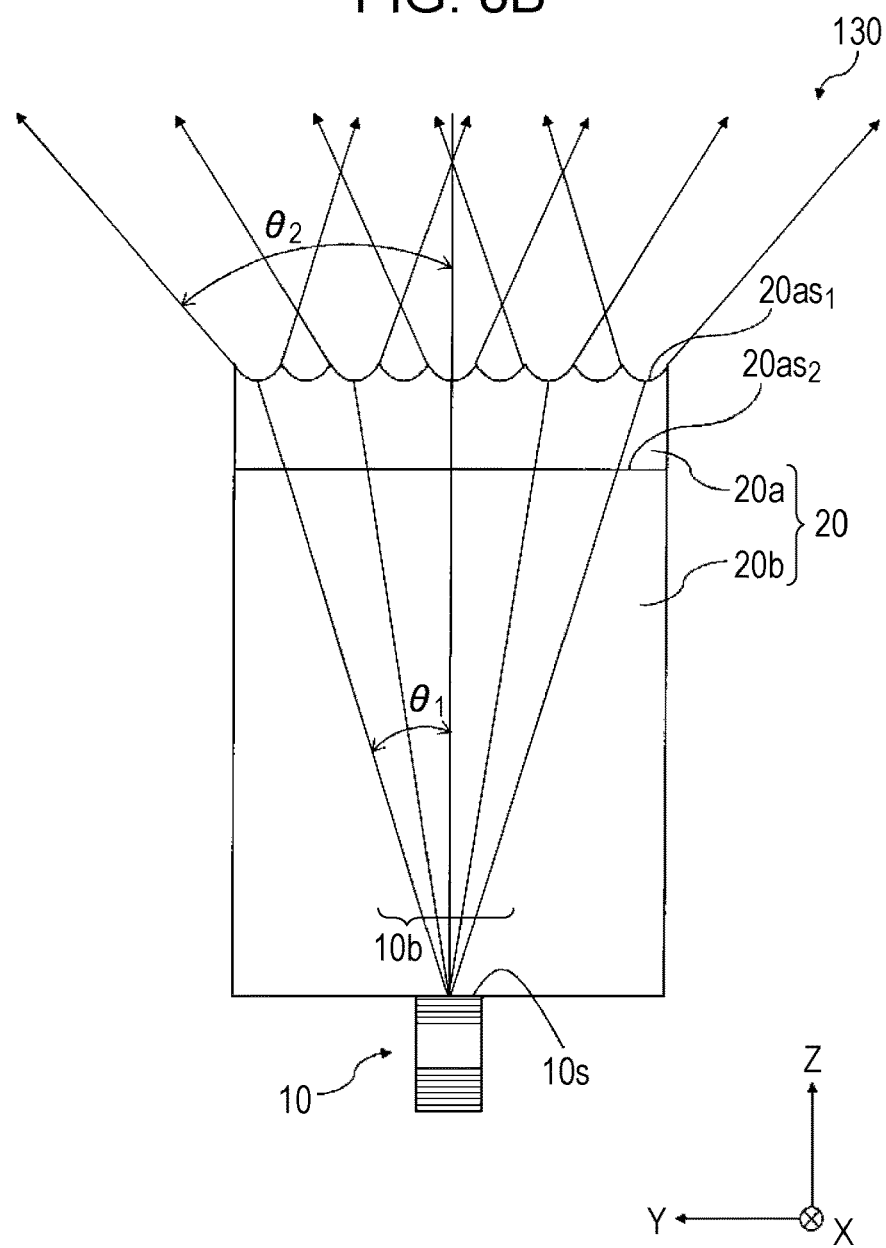
FIG. 8B is a diagram of the configuration shown in FIG. 8A as seen along the +X direction.

FIG. 8A is a perspective view schematically showing an example of an optical device 130 according to the third modification of Embodiment 1. FIG. 8B is a diagram of the configuration shown in FIG. 8A as seen along the +X direction. The optical device 130 according to the third modification differs from the optical device 100 according to Embodiment 1 in that the lens 20a of the optical element 20 is a lens array including a plurality of concave lenses regularly arranged along the Y direction. The plurality of concave lenses may be randomly arranged along the Y direction, and there may be variations in the curvature of the individual concave lenses. The lens array 20a covers a spot range of the optical beam 10b incident on the lens array 20a. Embodiment 1 is under the restriction that the beam radius r on the lens 20a cannot exceed the radius of curvature R of a lens. On the other hand, the third modification is free from such a restriction. A reason for this is that even when the radius of curvature R of each individual lens is smaller than the beam radius r of the optical beam 10b, the plurality of concave lenses covers the spot range of the optical beam 10b. This makes it possible to achieve the spread angle $\theta_2$ of the optical beam 10b in the dashed-line portion shown in FIG. 5B, thus making it possible to further increase the spread angle $\theta_2$.

Figure 8C:
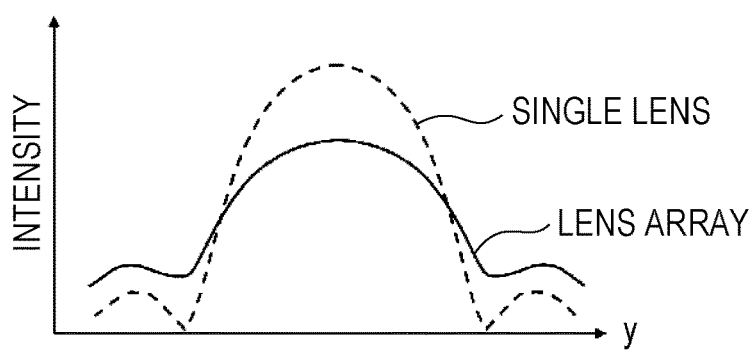
FIG. 8C is a diagram schematically showing intensity distributions in a far field of optical beams emitted from a lens array and a single lens.

FIG. 8C is a diagram schematically showing intensity distributions in a far field of optical beams 10b emitted from a lens array and a single lens. The solid line and the dashed line represent the intensity distributions of the optical beams 10b emitted from the lens array and the single lens, respectively. In the case of the single lens, the intensity of the optical beam 10b is substantially zero at both ends of the main lobe. On the other hand, in the case of the lens array, the intensity is higher at both ends of the optical beam 10b, and the maximum intensity of the optical beam 10b at the center is lower. The lens array, in which the individual lenses diffuse incident light as shown in FIG. 8B, can reduce non-uniformity in the intensity distribution as shown in FIG. 8C. This makes it possible to illuminate a wider region in the Y direction with a low-intensity optical beam 10b.

Figure 9:
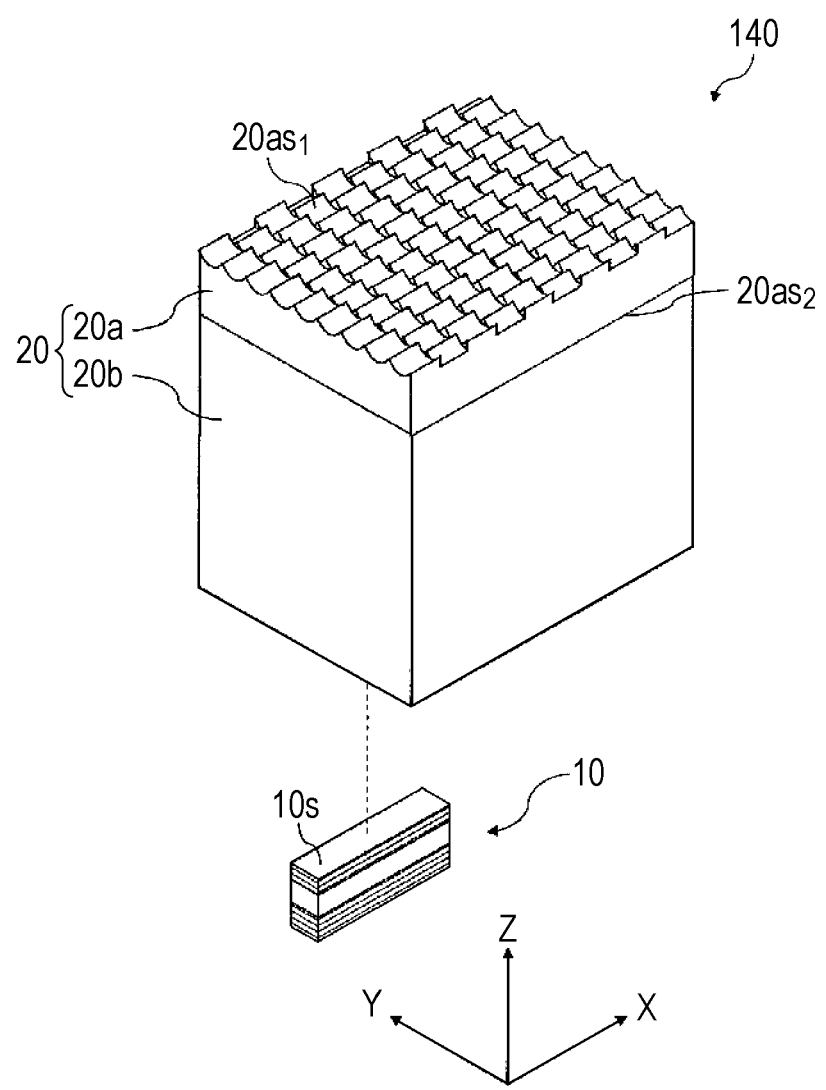
FIG. 9 is a perspective view schematically showing an example of an optical device according to a fourth modification of Embodiment 1.

FIG. 9 is a perspective view schematically showing an example of an optical device 140 according to the fourth modification of Embodiment 1. The optical device 140 according to the fourth modification differs from the optical device 130 according to the third modification in that the lens 20a of the optical element 20 is a lens array including a plurality of concave lenses regularly arranged along the X direction and the Y direction. The plurality of concave lenses may be randomly arranged along the X direction and the Y direction, and there may be variations in the curvature of the individual concave lenses. The optical beam 10b emitted from the light exit surface 10s is diffused in both the X direction and the Y direction. For the reason stated with reference to FIG. 8C, a wider region in the X direction and the Y direction can be illuminated with a low-intensity optical beam 10b.

Laser light intensities are categorized into classes according to JIS (Japanese Industrial Standards) C6802 "Safety of Laser Products". It is desirable, from the eye-safe point of view, that the intensity of laser light be categorized as Class 1. Even if an intensity distribution of an optical beam 10b emitted from the light exit surface 10s does not satisfy Class 1, the optical elements 20 shown in FIGS. 8A and 9 diffuse the optical beam 10b so that the intensity distribution of the optical beam 10b emitted from the light exit surface 10s satisfies Class 1.

Figure 10A:
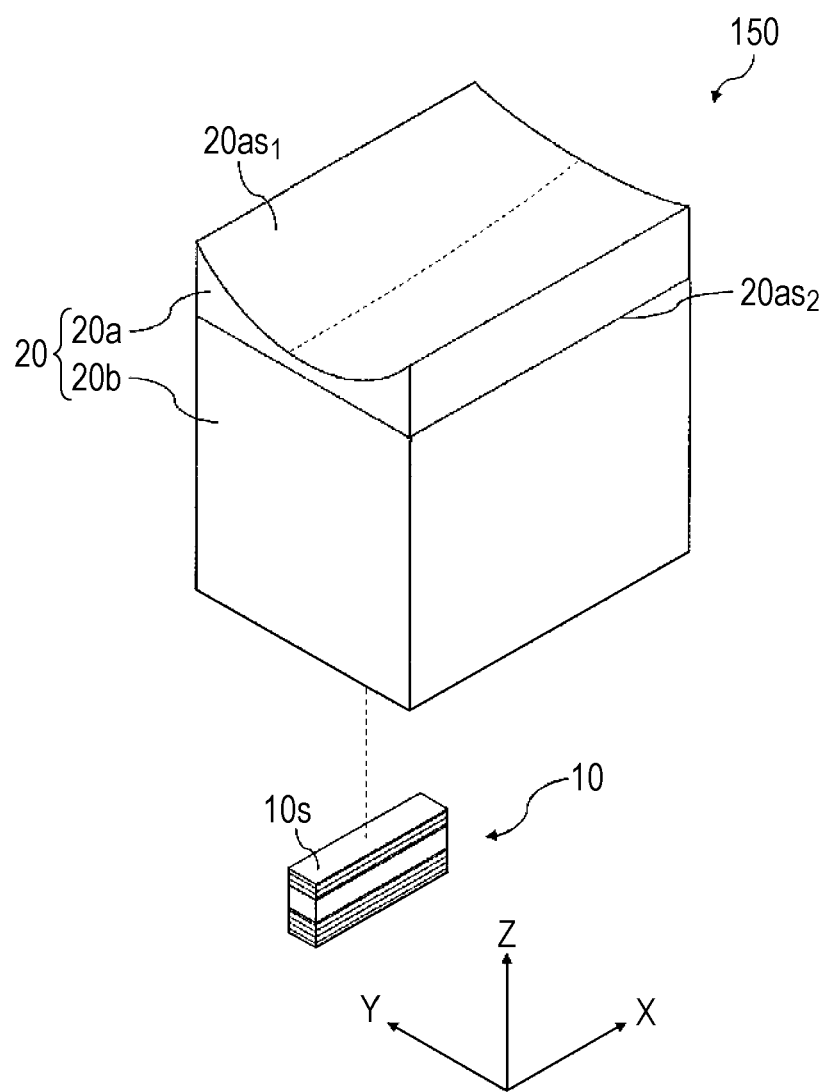
FIG. 10A is a perspective view schematically showing an example of an optical device according to a fifth modification of Embodiment 1.
Figure 10B:
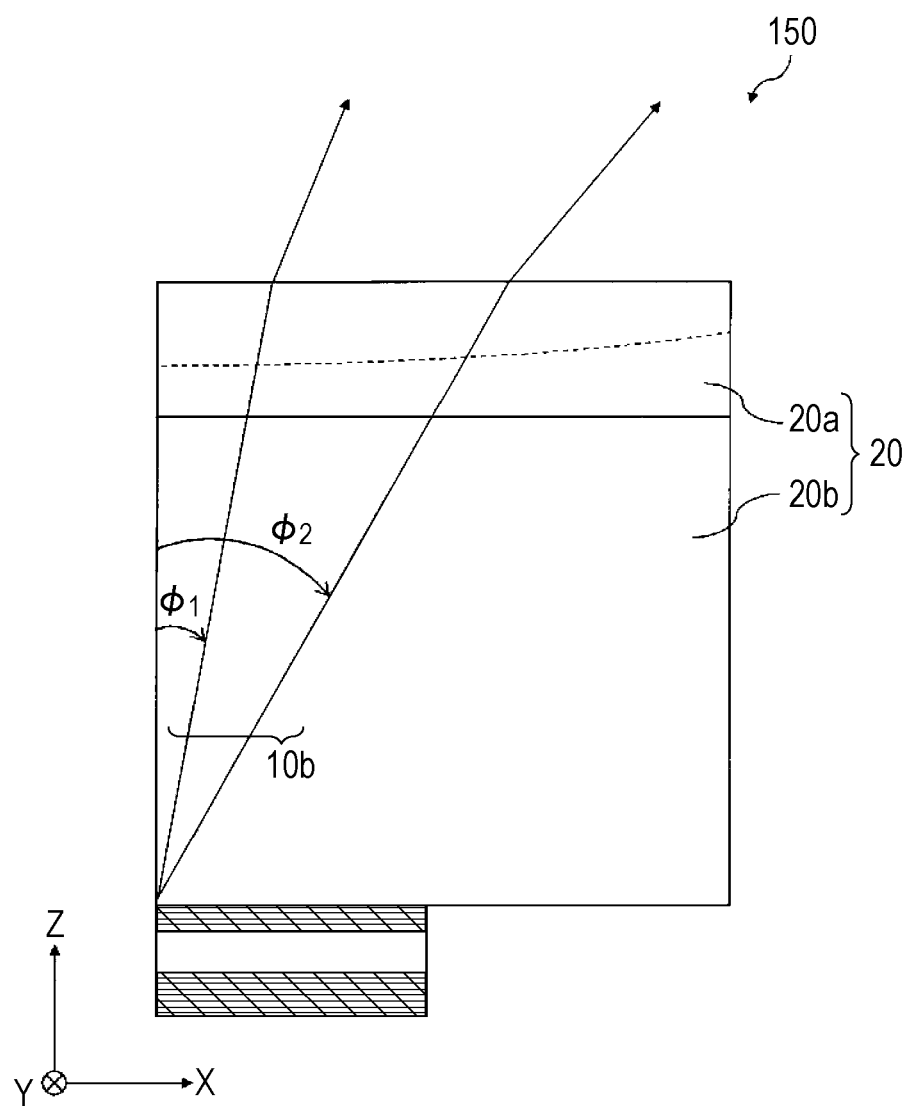
FIG. 10B is a diagram of the configuration shown in FIG. 10A as seen along the +Y direction.

FIG. 10A is a perspective view schematically showing an example of an optical device 150 according to the fifth modification of Embodiment 1. FIG. 10B is a diagram of the configuration shown in FIG. 10A as seen along the +Y direction. The dashed line shown in FIGS. 10A and 10B is a line connecting stationary points in the Y direction on the concave lens 20a. The optical device 150 according to the fifth modification differs from the optical device 100 according to Embodiment 1 in that the curvature of the lens 20a of the optical element 20 in the Y direction monotonically changes along the X direction. In this way, the optical element 20 has a portion in which the curvature of the lens 20a in the Y direction changes along the X direction. As shown in FIG. 10B, when the angle of emission of the optical beam 10b increases from $\varphi_1$ to $\varphi_2$, the optical beam 10b travels a longer distance through the lens 20a. The curvature of the lens 20a with respect to an optical beam 10b having a certain angle of emission can be found from a cross-section of the lens 20a exposed by making a cut through the lens 20a along the following plane. The plane is a plane parallel to both the direction of emission of the optical beam 10b within the optical element 20 and the Y direction. When the curvature of the lens 20a in the Y direction is constant along the X direction, the curvature of the lens 20a with respect to the optical beam 10b increases as the angle of emission of the optical beams 10b increases. On the other hand, in the example shown in FIG. 10B, the curvature of the lens 20a with respect to the optical beam 10b can be held constant regardless of the angle of emission by causing the curvature of the lens 20a in the Y direction to monotonically decrease along the +X direction. In the optical device 150 according to the fifth modification, the spread angle $\theta_2$ of the optical beam 10b is constant regardless of the angle of emission of the optical beam 10b. The shape and intensity distribution of the optical beam 10b do not depend on the angle of emission of the optical beam 10b. Even if the curvature of the lens 20a with respect to the optical beam 10b is not strictly constant regardless of the angle of emission, variations in the shape and intensity distribution of the optical beam 10b due to change of the angle of emission can be reduced.

Although, in the fifth modification, the upper surface 20$as_1$ of the optical element 20 serves as a lens surface and the curvature of the upper surface 20$as_1$ changes along the X direction, the lower surface 20$as_2$ of the optical element 20 may serve as a lens surface and the curvature of the lower surface 20$as_2$ may change along the X direction. In this case, the upper surface 20$as_1$ may be flat.

Figure 10C:
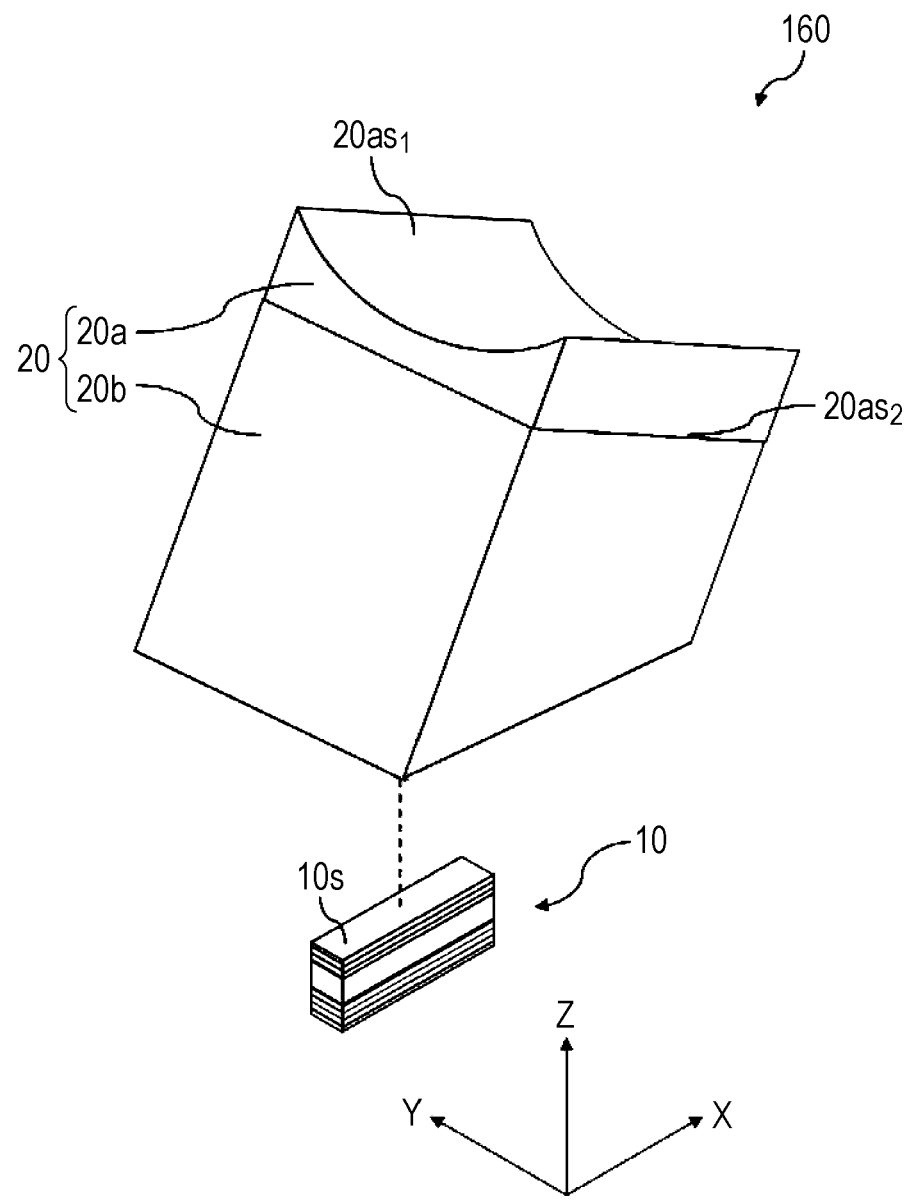
FIG. 10C is a perspective view schematically showing an example of an optical device according to a sixth modification of Embodiment 1.
Figure 10D:
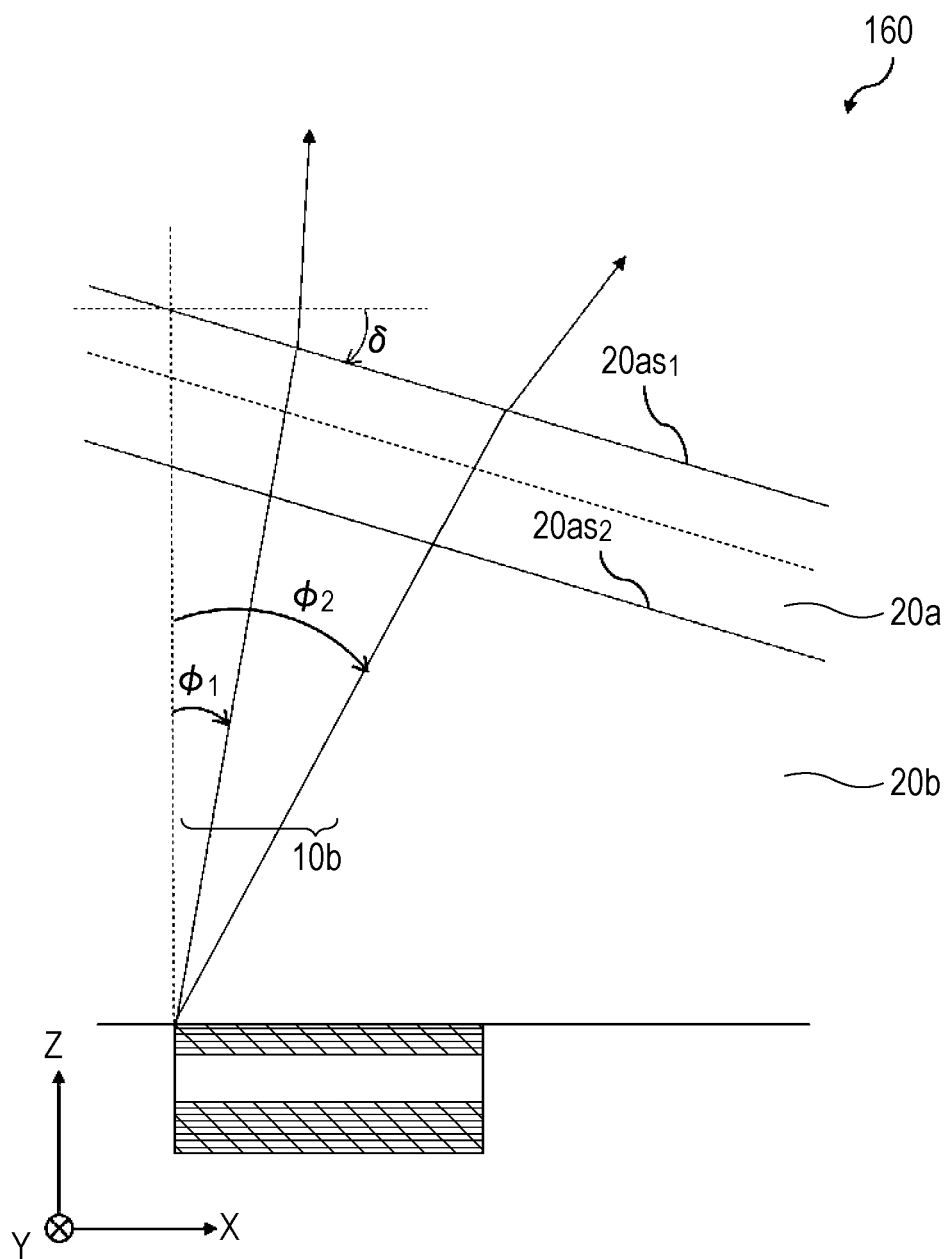
FIG. 10D is a diagram of the configuration shown in FIG. 10C as seen along the +Y direction.

FIG. 10C is a perspective view schematically showing an example of an optical device 160 according to a sixth modification of Embodiment 1. FIG. 10D is a diagram of the configuration shown in FIG. 10C as seen along the +Y direction. As in the case of the aforementioned embodiment, the medium 20b may not be in contact with the light exit surface 10s of the optical deflector 10. The optical element 20 of the optical device 160 according to the sixth modification has a portion in which the curvature of the lens 20a in the Y direction is constant along the X direction. The optical device 160 according to the sixth modification differs from the optical device 100 according to Embodiment 1 in that the upper surface 20$as_1$, which is a surface of the lens 20a through which light exits from the optical element 20 and which is a lens surface, is inclined along the X direction with respect to the light exit surface 10s of the optical deflector 10. That is, the distance between the light exit surface 10s and the lens surface 20$as_1$ along a direction perpendicular to the light exit surface 10s changes along the X direction. FIG. 10D assumes that δ is an angle formed when the lens surface 20$as_1$ and the light exit surface 10s are seen in the X direction.

In a case where the curvature of the lens 20a is constant along the X direction, the focal length of the lens 20a is constant along the X direction. Meanwhile, macroscopically, the light 10b from the optical deflector 10 can be deemed to be emitted from one sufficiently small point. Varying the angle of emission of the optical beam 10b between $\varphi_1$ and $\varphi_2$ causes the shape and intensity distribution of the optical 10b to change depending on the angle of emission. A reason for this is that an optical path length from the point of emission of the optical beam 10b to the lens surface 20$as_1$ varies, although the focal length of the lens 20a is constant. The optical device 160 according to the sixth modification can reduce this optical path length variation. It is most preferable here that the angle δ be equal to an intermediate value (i.e. ($\varphi_1+\varphi_2$)/2) in the range of the angle of emission of the optical beam 10b.

The following shows an example of calculation for explaining effects brought about by the sixth modification. The following example of calculation assumes that $\varphi_1=5°$ and $\varphi_2=35°$. Let it be also assumed that at an intermediate angle of emission of 20 degrees, the optical path length from the point of emission of the optical deflector 10 to the lens surface is 10 mm. In a case where δ=0°, the optical path length from the point of emission to the lens surface with respect to a direction perpendicular to the light exit surface 10s of the optical deflector 10 (i.e. a direction equivalent to an angle of emission of 0 degree) is given as 10×cos 20°=9.40 mm. The optical path length at an angle of emission of 5 degrees is given as (10×cos 20°)/cos 5°=9.43 mm, and the optical path length at an angle of emission of 35 degrees is given as (10×cos 20°)/cos 35°=11.47 mm. Therefore, when the angle of emission changes from 5 degrees to 35 degrees, the range of change in the optical path length is 2.04 mm.

Meanwhile, in a case where δ=(5°+35°)/2=20° in the configuration shown in FIGS. 10C and 10D, the optical path length at an angle of emission of 5 degrees is given as 10×cos(20°−5°)=10.35 mm, and the optical path length at an angle of emission of 35 degrees is given as 10×cos(20°−35°)=10.35 mm. Therefore, the range of change in the optical path length is 0.35 mm. This shows that the range of change can be reduced to 17% as compared with the case where δ=0°.

Thus, the optical device 160 according to the sixth modification can reduce the variation in optical path length, which depends on the angle of emission, while holding the curvature of the lens 20a constant along the X direction. This results in making it possible to reduce variations in the shape and intensity distribution of the optical beam 10b entailed by beam scanning.

Although, in the sixth modification, the lower surface 20$as_2$ of the optical element 20 is inclined along the X direction, the lower surface 20$as_2$ of the optical element 20 may be parallel to the light exit surface 10s of the optical deflector 10. Further, the medium 20 may have its light entrance surface inclined along the X direction instead of being parallel to the light exit surface 10s.

Figure 10E:
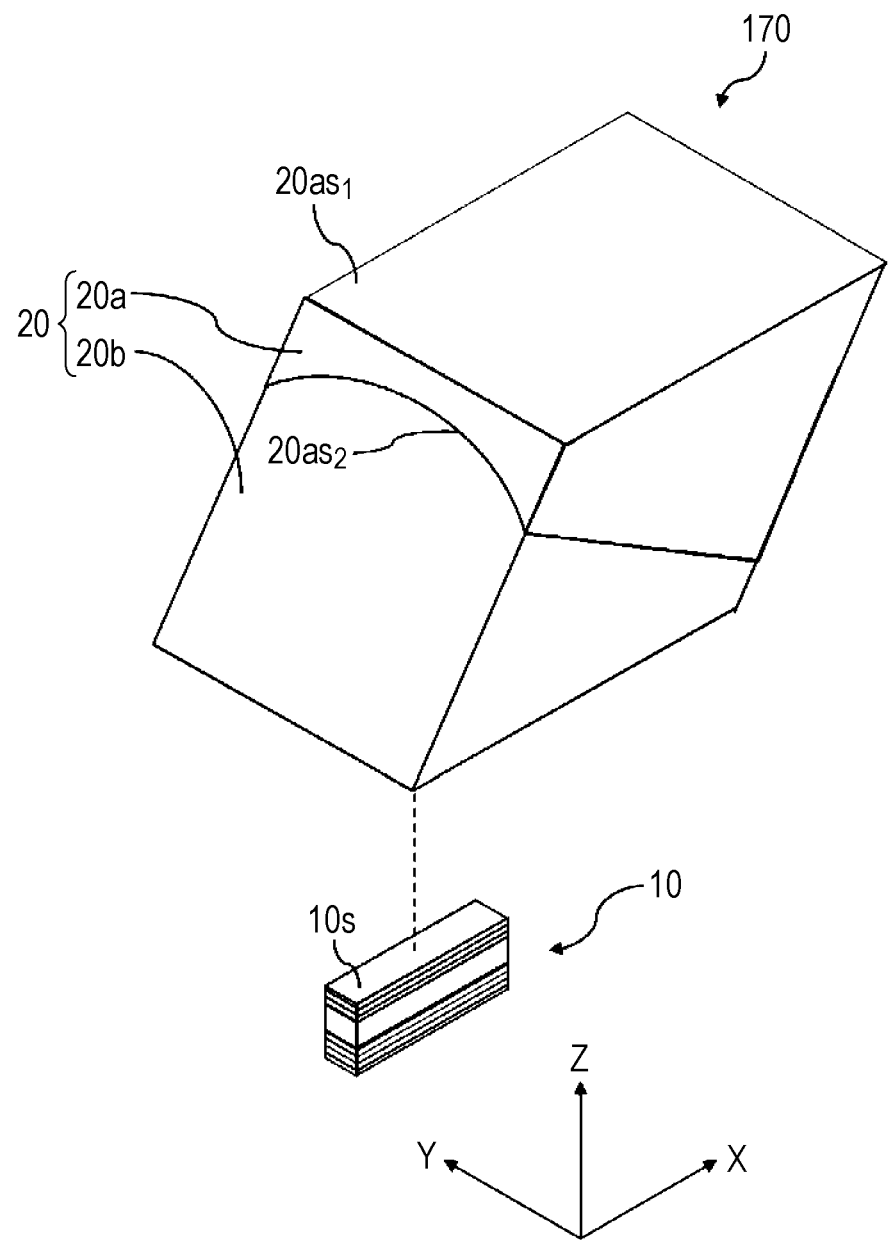
FIG. 10E is a perspective view schematically showing an example of an optical device according to a seventh modification of Embodiment 1.
Figure 10F:
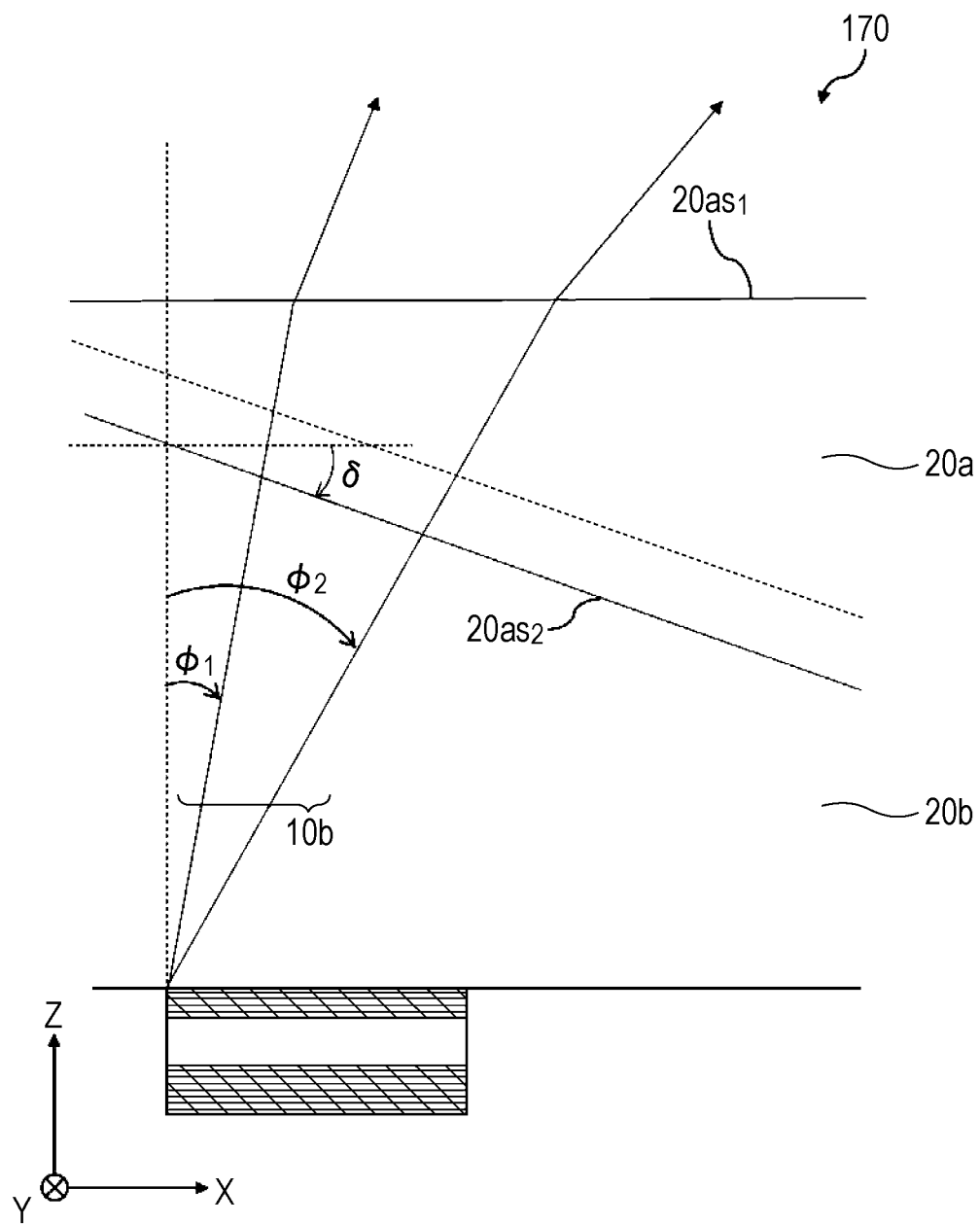
FIG. 10F is a diagram of the configuration shown in FIG. 10E as seen along the +Y direction.

The lens surface of the lens 20a may be formed on the lower surface 20$as_2$, which is an entrance surface. FIG. 10E is a perspective view schematically showing an example of an optical device 170 according to a seventh modification of Embodiment 1. FIG. 10F is a diagram of the configuration shown in FIG. 10E as seen along the +Y direction. The optical device 170 according to the seventh modification differs from the optical device 160 according to the sixth modification in that the distance between the light exit surface 10s and the lower surface 20$as_2$ of the optical element 20 along a direction perpendicular to the light exit surface 10s changes along the X direction.

Although, in the seventh modification, the upper surface 20$as_1$ of the optical element 20 is parallel to the light exit surface 10s of the optical deflector 10, the upper surface 20$as_1$ of the optical element 20 may be inclined along the X direction. Further, the medium 20 may have its light entrance surface inclined along the X direction instead of being parallel to the light exit surface 10s.

Embodiment 2

Figure 11:
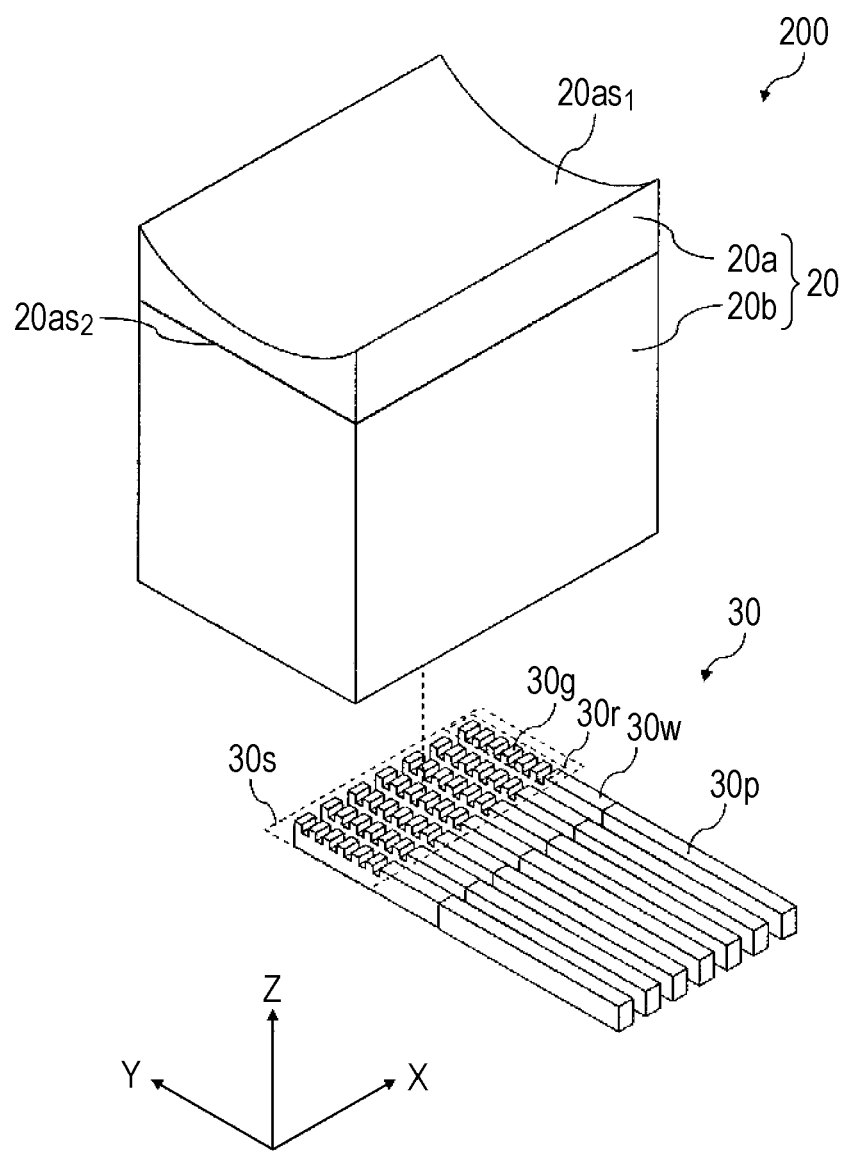
FIG. 11 is a perspective view schematically showing an example of an optical device according to Embodiment 2 of the present disclosure.

Next, a basic example configuration of an optical device according to Embodiment 2 of the present disclosure is described with reference to FIG. 11. FIG. 11 is a perspective view schematically showing an example of an optical device 200 according to Embodiment 2 of the present disclosure. Although, for ease of comprehension of explanation, FIG. 11 shows constituent elements separate from each other, these constituent elements may be in contact with each other. The optical device 200 according to Embodiment 2 includes an optical deflector 30 and an optical element 20.

The optical deflector 30 according to Embodiment 2 includes a plurality of optical waveguides 30w and a plurality of phase shifters 30p connected separately to each of the plurality of optical waveguides 30w. The plurality of optical waveguides 30w are arranged along the X direction and extend along the Y direction. The number of optical waveguides 30w may for example be larger than or equal to 8 and smaller than or equal to 64. The plurality of optical waveguides 30w include, on their surfaces, light exit regions 30r from which light is emitted. Each of the plurality of light exit regions 30r is provided with a grating 30g. The optical waveguide 30w has a higher refractive index than an external medium such as air. The optical waveguide 30w allows propagation of light along the Y direction by total reflection. By being diffracted by the grating 30g, light propagating along the Y direction through the optical waveguide 30w is emitted outward from the light exit region 30r as a plurality of diffraction rays parallel to the Y-Z plane. The length of the light exit region 30r in the Y direction may for example be greater than or equal to 1 µm and less than or equal to 10 µm. The number of depressed portions in the grating 30g may for example be set to be larger than or equal to 4 and smaller than or equal to 16. The length of the depressed portions per cycle, i.e. the duty ratio, in the grating 30g may be subject to change as appropriate according to the depth and number of depressed portions of the grating. In the optical deflector 30 according to Embodiment 2, an optical beam is formed by interference of light emitted from the plurality of optical waveguides 30w. The optical beam can be said to be emitted outward from a light exit surface 30s including the plurality of light exit regions 30r. The optical beam has a shape extended along the Y direction by an overlap between a plurality of diffraction rays parallel to the Y-Z plane.

As is the case with the plurality of optical waveguides 30w, the plurality of phase shifters 30p are arranged along the X direction and extend along the Y direction. Each of the phase shifters 30p may be configured such that there are changes in the refractive index according to changes in driving voltage applied. In one example, the phase shifter 30p may be formed from a thermo-optic material whose refractive index changes with changing temperature. The phase shifter 30p includes a heater (not illustrated) that changes the temperature of the thermo-optic material. The heater (not illustrated) is provided with two electrodes through which the driving voltage is applied. In another example, the phase shifter 30p may be formed from an electro-optic material whose refractive index changes with changing driving voltage. The phase shifter 30p is provided with two electrodes through which the driving voltage is applied to the electro-optic material. When the driving voltage changes upon input of a control signal from a control circuit (not illustrated), the refractive index of the phase shifter 30p changes, so that the phase of light that passes through the phase shifter 30p shifts. In the optical deflector 30 according to Embodiment 2, the driving voltage changes in response to the control signal, and the phases of light incident on the plurality of optical waveguides 30w from the plurality of phase shifters 30p are shifted by a certain amount with respect to one another in the order in which the plurality of optical waveguides 30w are arranged. This phase shift allows the direction of emission of the optical beam to change along the X direction.

Figure 12A:
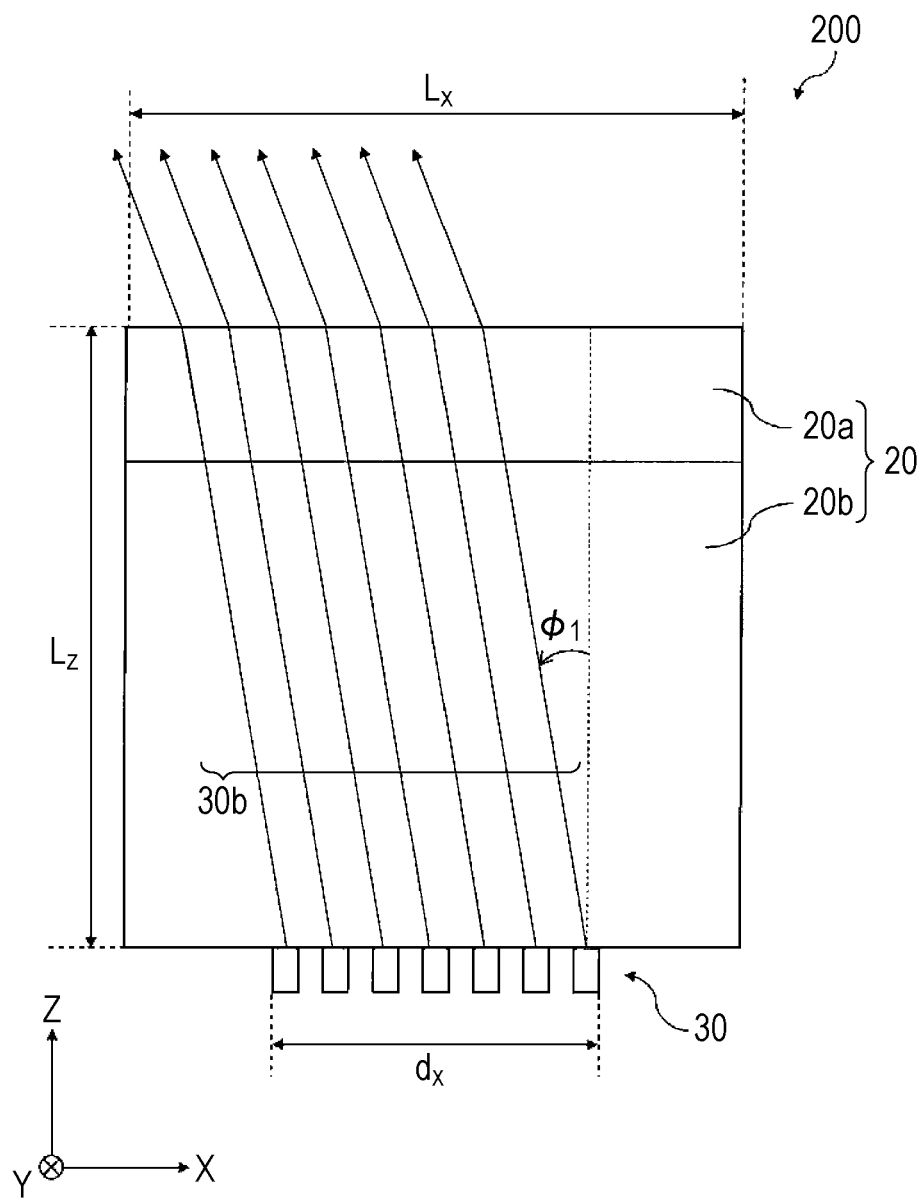
FIG. 12A is a diagram of the configuration shown in FIG. 11 as seen along the +Y direction.
Figure 12B:
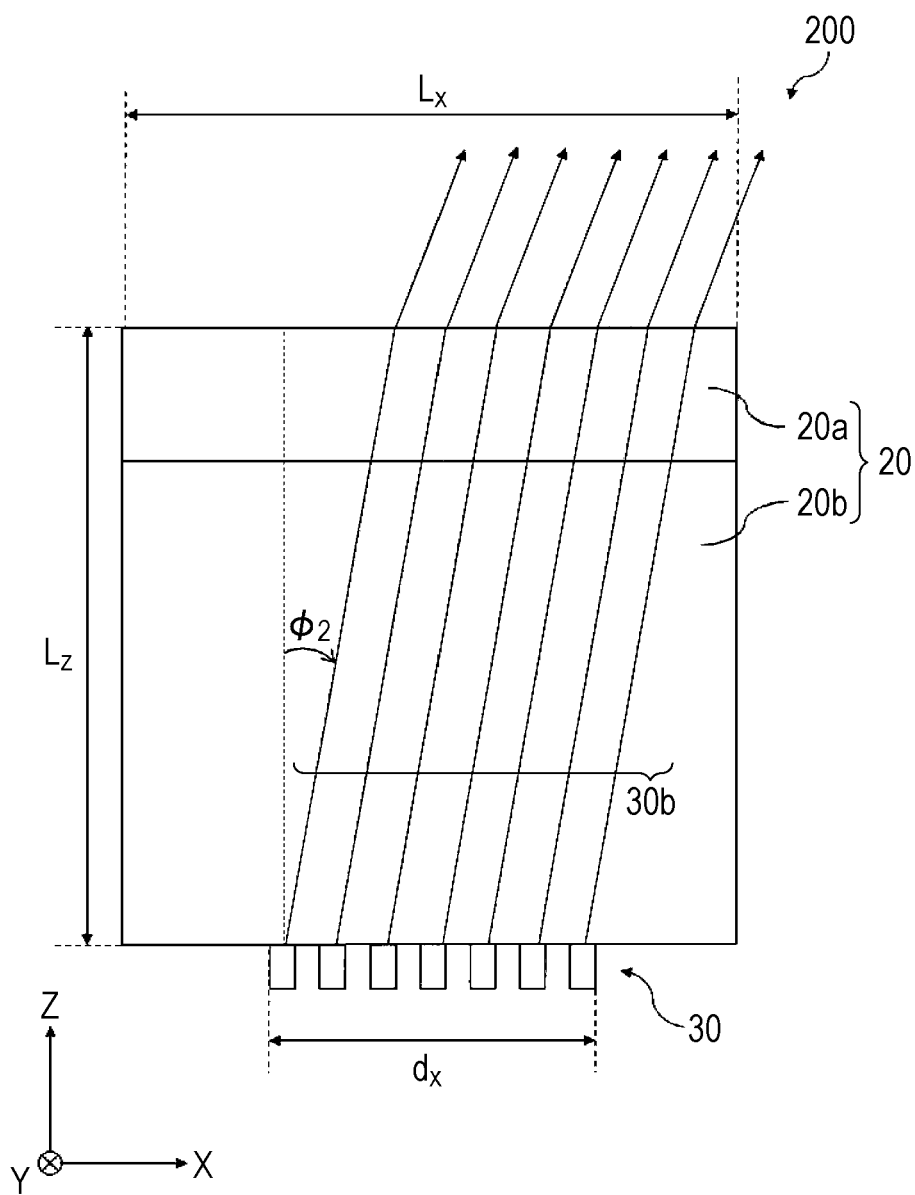
FIG. 12B is a diagram of the configuration shown in FIG. 11 as seen along the +Y direction.

Next, changes in the direction of emission of an optical beam 30b emitted from the light exit surface 30s of the optical deflector 30 are described with reference to FIGS. 12A and 12B. FIGS. 12A and 12B are diagrams of the configuration shown in FIG. 11 as seen along the +Y direction. In the examples shown in FIGS. 12A and 12B, the optical deflector 30 and the optical element 20 are in contact with each other and disposed to be symmetrical with a plane parallel to the Y-Z plane. In the examples shown in FIGS. 12A and 12B, the angle of emission of the optical beam 30b varies from $\varphi_1$ to $\varphi_2$. In the optical deflector 30 according to Embodiment 2, unlike in the optical deflector 10 according to Embodiment 1, $\varphi_1$ has a negative value, and $\varphi_2$ has a positive value. The absolute value of $\varphi_1$ and the absolute value $\varphi_2$ may be equal to or different from each other. The length $L_x$ of the optical element 20 in the X direction is designed to be longer than the length $d_x$ of the optical deflector 30 in the X direction so that all of the optical beam 30b having passed through the optical element 20 is efficiently emitted outward from the upper surface $20as_1$ of the lens 20a of the optical element 20. Specifically, the length $L_x$ of the optical element 20 is designed according to the length $d_x$ of the optical deflector 30, the minimum angle of emission $\varphi_1$ of the optical beam 30b, the maximum angle of emission $\varphi_2$ of the optical beam 30b, and the height $L_z$ of the optical element 20 in the Z direction. The optical beam 30b is refracted by the upper surface $20as_1$ of the lens 20a and emitted outward.

Figure 13:
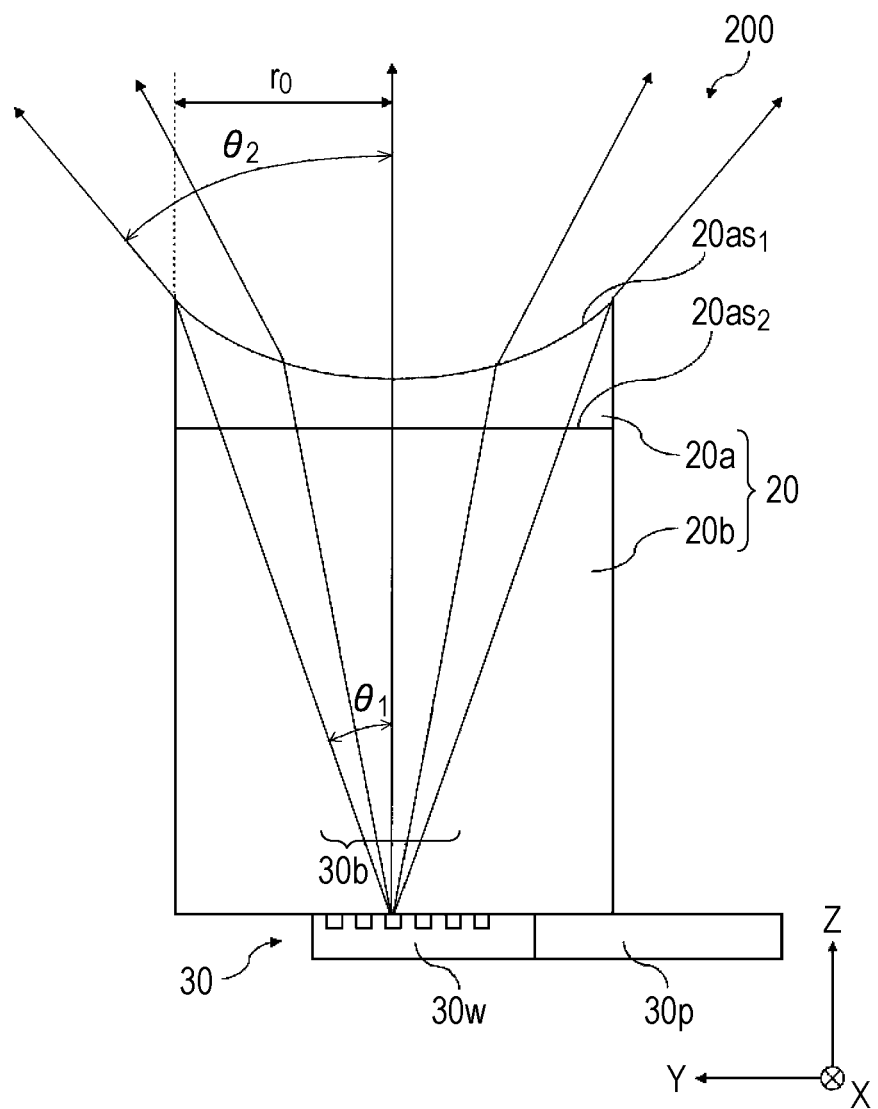
FIG. 13 is a diagram of the configuration shown in FIG. 11 as seen along the +X direction.

Next, the extent of spread in the Y direction of the optical beam 30b having passed through the optical element 20 is described with reference to FIG. 13. FIG. 13 is a diagram of the configuration shown in FIG. 11 as seen along the +X direction. The optical element 20 according to Embodiment 2 is as described with reference to FIG. 4. As shown in FIG. 13, the spread angle $\theta_2$ of the optical beam 30b is increased by the optical element 20. As the optical element 20 according to Embodiment 2, the optical element 20 according to any of the first to fifth modifications of Embodiment 1 may be used.

In the optical device 200 according to Embodiment 2 too, providing the optical element 20 on the optical deflector 30 makes it possible to increase the spread angle $\theta_2$ of the optical beam 30b. This makes it possible to easily obtain an optical beam 30b having an extent of spread suitable for the intended use.

Embodiment 3

Figure 14:
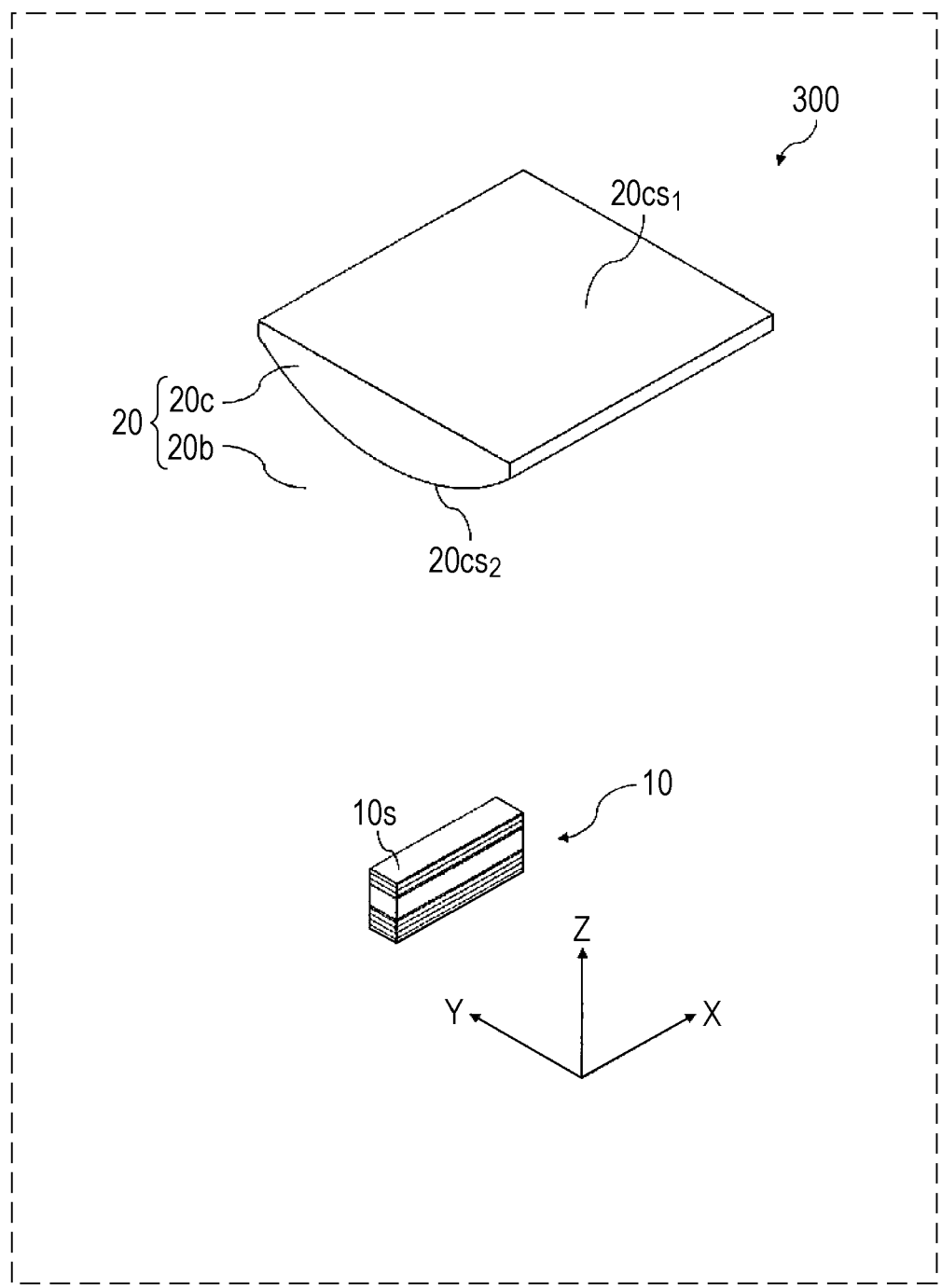
FIG. 14 is a perspective view schematically showing an example of an optical device according to Embodiment 3 of the present disclosure.

Next, a basic example configuration of an optical device according to Embodiment 3 of the present disclosure is described with reference to FIG. 14. FIG. 14 is a perspective view schematically showing an example of an optical device 300 according to Embodiment 3 of the present disclosure. The optical device 300 according to Embodiment 3 differs from the optical device 100 according to Embodiment 1 in that the optical element 20 includes a mirror 20c instead of the lens 20a. The optical element 20 according to Embodiment 3 includes the mirror 20c and the medium 20b. The mirror 20c is a plano-convex mirror having an upper surface $20cs_1$ and a lower surface $20cs_2$. The mirror 20c is configured such that the upper surface $20cs_1$ is a flat surface and the lower surface $20cs_2$ has a curvature in the Y direction. The lower surface $20cs_2$ of the mirror 20c is equivalent to a reflecting surface. The reflectivity of the reflecting surface may for example be higher than or equal to 90% at the wavelength of the optical beam 10b. The mirror 20c is a cylindrical mirror having a structure extending in the X direction. The curvature of the plano-convex mirror is equal to the curvature of the plano-concave lens according to Embodiment 1. The medium 20b is as described above. In the example shown in FIG. 14, the medium 20b is air. In the example shown in FIG. 14, the direction in which the reflecting surface $20cs_2$ of the mirror 20c extends is parallel with the direction in which the light exit surface 10s of the optical deflector 10 extends. In this way, the reflecting surface $20cs_2$ of the mirror 20c faces the light exit surface 10s of the optical deflector 10.

Figure 15A:
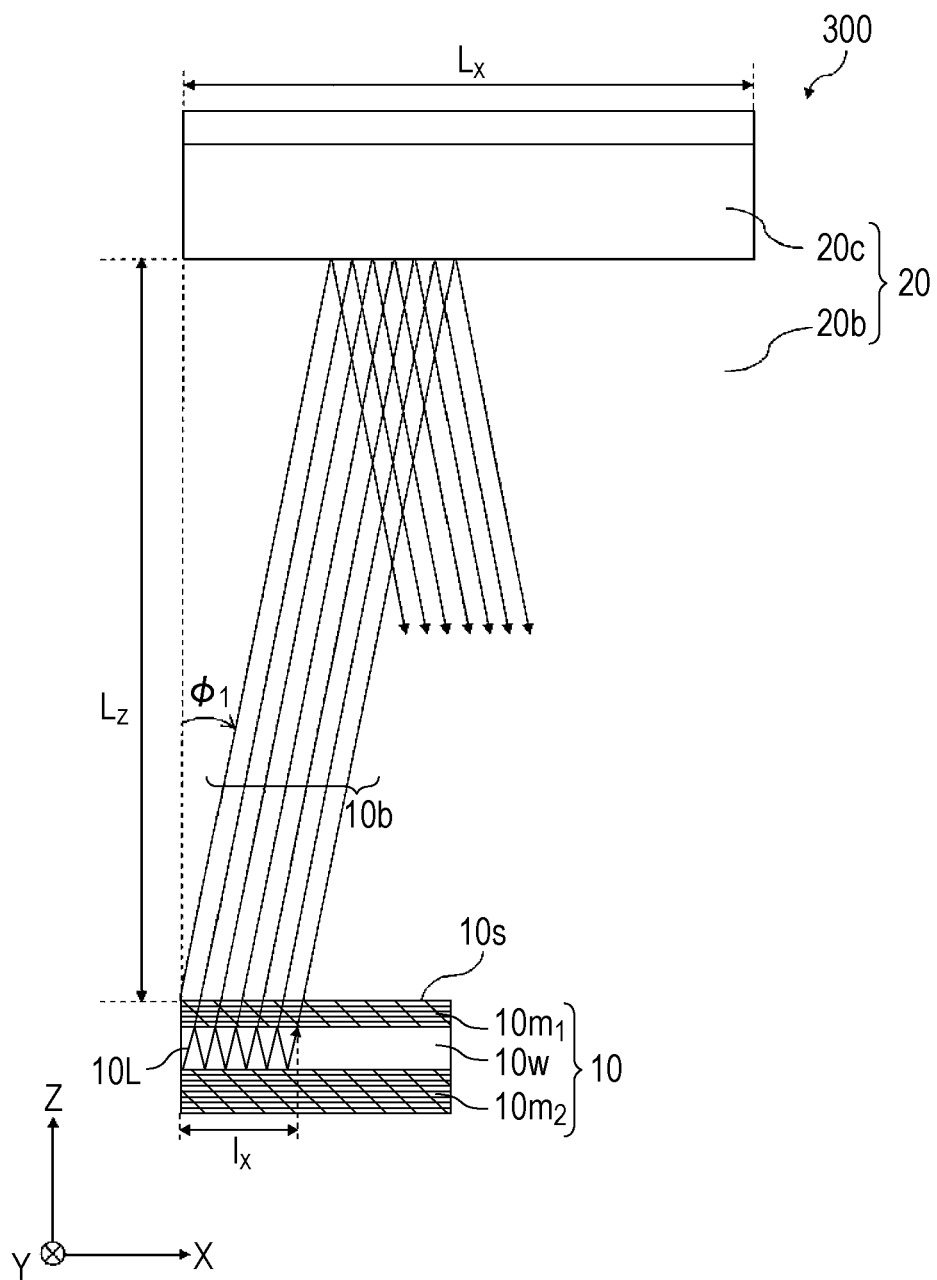
FIG. 15A is a diagram of the configuration shown in FIG. 14 as seen along the +Y direction.
Figure 15B:
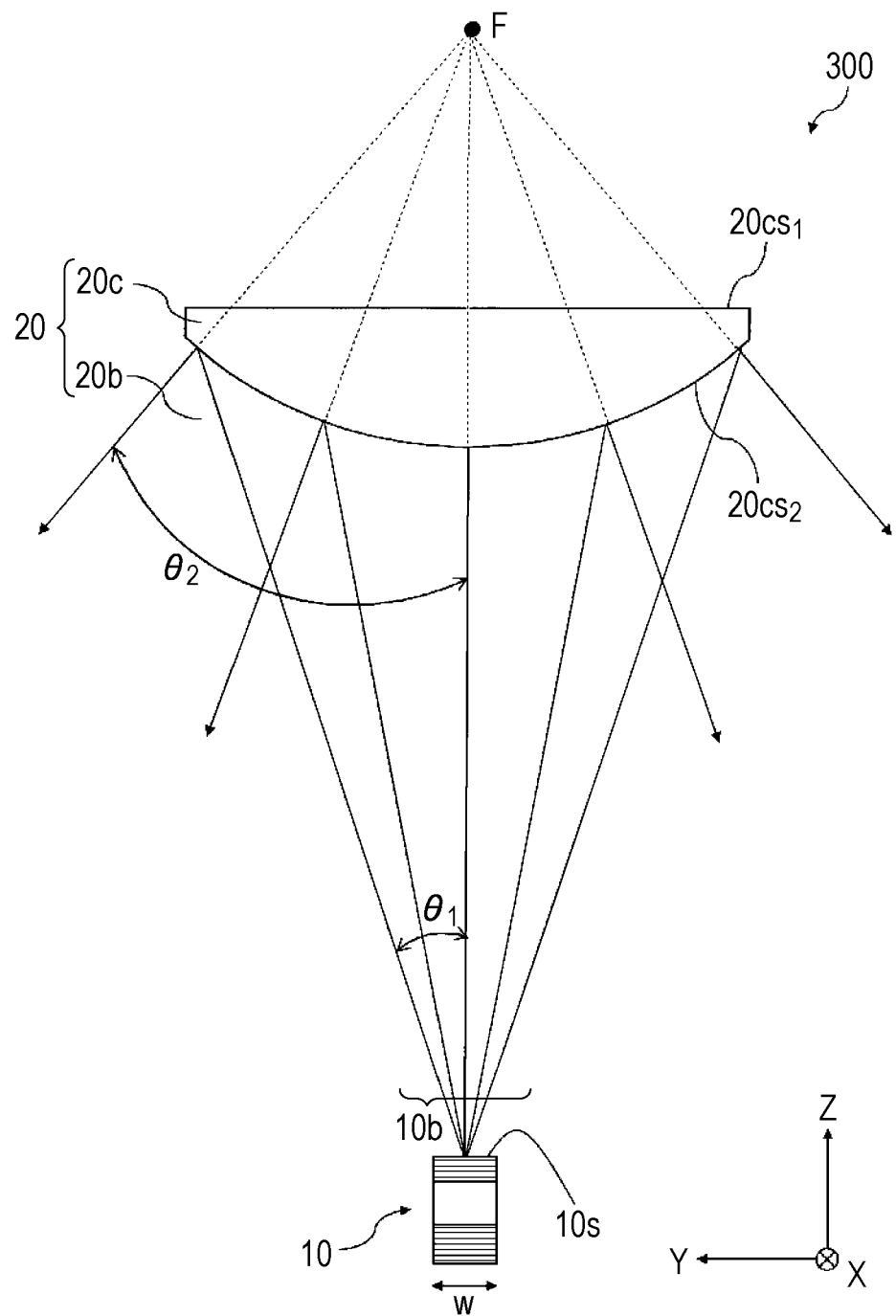
FIG. 15B is a diagram of the configuration shown in FIG. 14 as seen along the +X direction.

FIGS. 15A and 15B are diagrams of the configuration shown in FIG. 14 as seen along the +Y direction and the +X direction, respectively. As shown in FIG. 15A, the optical beam 10b emitted upward from the optical deflector 10 is reflected downward by the mirror 20c. More desirably, the shortest distance $L_z$ between the reflecting surface $20cs_2$ of the mirror 20c and the light exit surface 10s of the optical deflector 10 is designed to satisfy the following condition. The condition is that the optical beam 10b emitted at the minimum angle of emission $\varphi_1$ and reflected by the reflecting surface $20cs_2$ of the mirror 20c does not fall on the light exit surface 10s again. A reason for this is that if the optical beam 10b falls on the light exit surface 10s again, there will be a loss of the optical beam 10b when it is emitted outward. As shown in FIG. 15B, the extent of spread of the optical beam 10b reflected downward increases. The focal point F of rays of light reflected by the mirror 20c is located above the lower surface $20cs_2$ of the mirror 20c. As noted above, in a case where the plano-concave lens according to Embodiment 1 is replaced by a plano-convex mirror, the extent of spread of the optical beam 10b is expanded in a similar fashion, although there is a difference between transmission and reflection of the optical beam 10b.

Modification of Embodiment 3

Figure 16A:
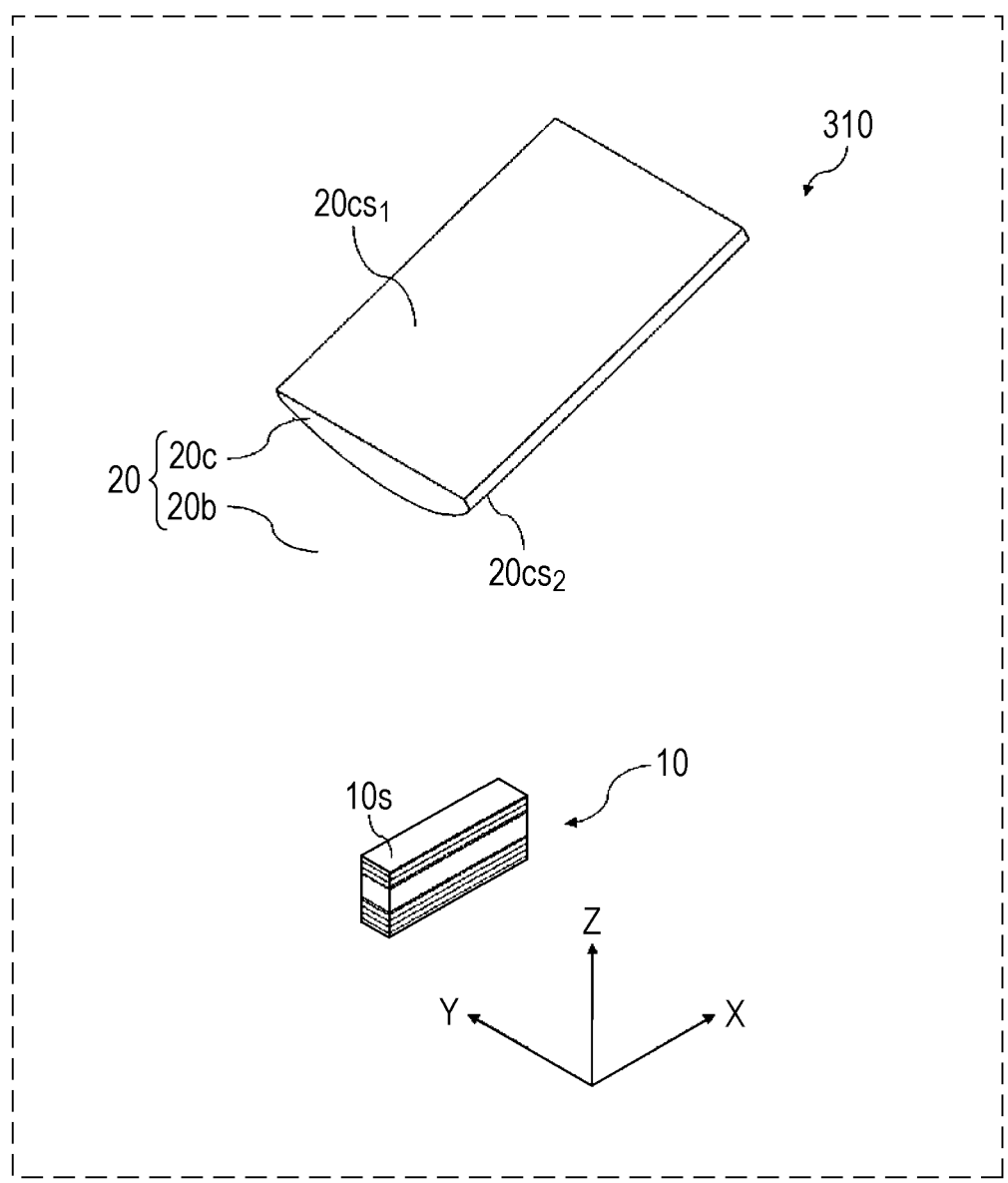
FIG. 16A is a perspective view schematically showing an example of an optical device according to a modification of Embodiment 3.
Figure 16B:
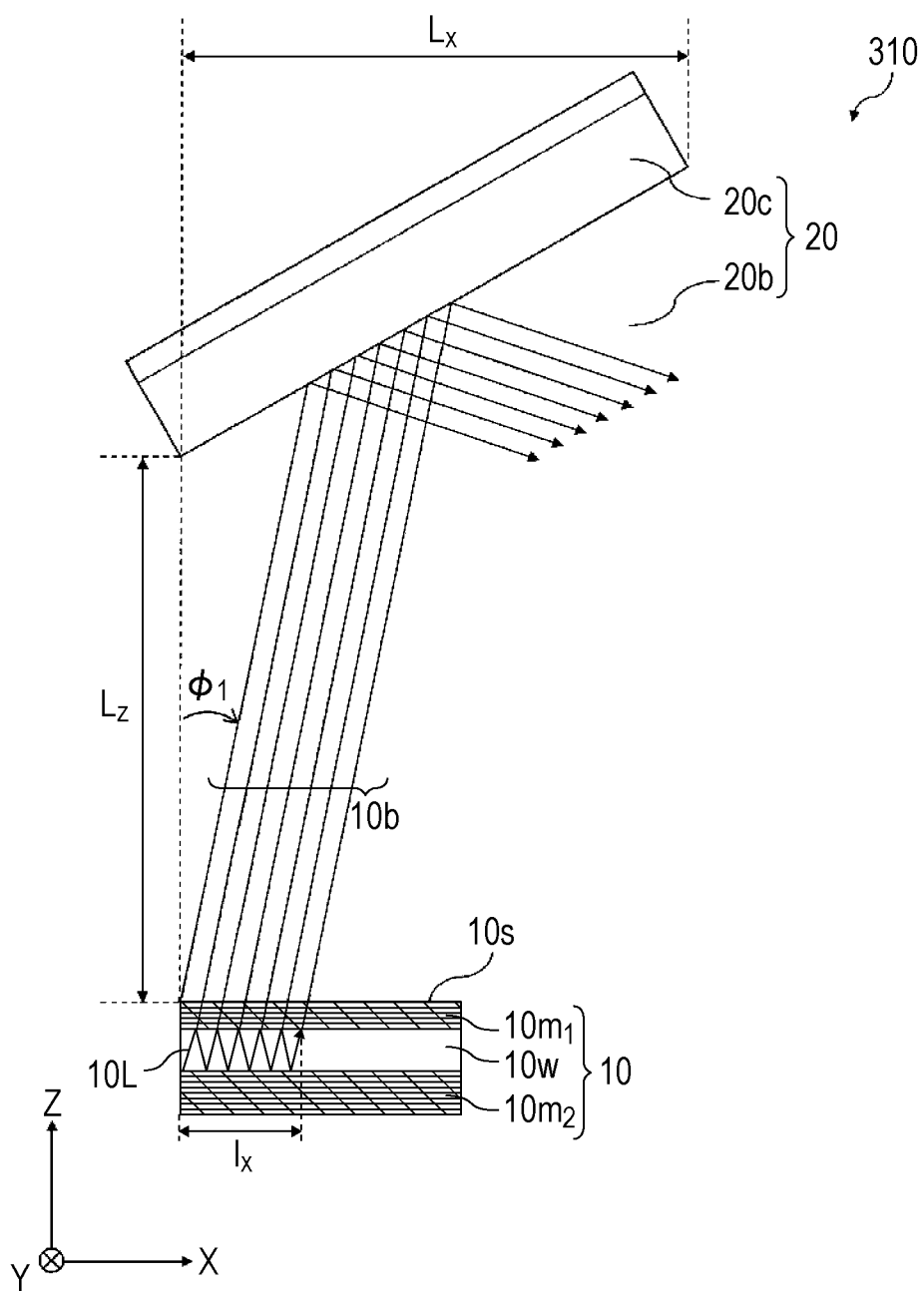
FIG. 16B is a diagram of the configuration shown in FIG. 16A as seen along the +Y direction.

Next, a modification of the optical device 300 according to Embodiment 3 is described with reference to FIGS. 16A and 16B. FIG. 16A is a perspective view schematically showing an example of an optical device 310 according to a modification of Embodiment 3. FIG. 16B is a diagram of the configuration shown in FIG. 16A as seen along the +Y direction. The optical device 310 according to the modification of Embodiment 3 differs from the optical device 300 according to Embodiment 3 in that the direction in which the reflecting surface $20cs_2$ of the mirror 20c extends is not parallel with the direction in which the light exit surface 10s of the optical deflector 10 extends. In this way, the reflecting surface $20cs_2$ of the mirror 20c is inclined with respect to the light exit surface 10s of the optical deflector 10. This makes it possible to significantly reduce the possibility that the optical beam 10b emitted downward by the reflecting surface $20cs_2$ of the mirror 20c may fall on the light exit surface 10s again. Furthermore, as shown in FIG. 16B, the shortest distance $L_z$ between the reflecting surface $20cs_2$ of the mirror 20c and the light exit surface 10s of the optical deflector 10 can be shortened. If the shortest distance $L_z$ can be shortened, the optical beam 10 emitted from the optical deflector 10 can be reflected by the mirror 20c before the optical beam 10b widely spreads. This makes it possible to reduce the size of the mirror 20c in the Y direction.

In an optical device according to the present disclosure, as shown in FIGS. 14 and 16A, the light exit surface 10s of the optical deflector 10 faces in the direction in which the reflecting surface $20cs_2$ of the mirror 20c is located. The optical beam 10b emitted from the light exit surface 10s of the optical deflector 10 falls on the reflecting surface $20cs_2$ of the mirror 20c.

Besides the aforementioned example, in a case where the plano-convex lens according to the first or second modification of Embodiment 1 is replaced by a plano-concave mirror, the extent of the optical beam 10b is expanded or reduced in a similar fashion, although there is a difference between transmission and reflection of the optical beam 10b. As shown in FIGS. 8A and 9, the mirror 20c may include a plurality of mirrors. As shown in FIG. 10A, the mirror 20c may have a portion whose curvature in the Y direction changes along the X direction.

An optical device according to an embodiment of the present disclosure can be utilized for use, for example, in the measurement of the distance to a physical object.

What is claimed is:
1. An optical device comprising:
an optical deflector that emits, through a light exit surface parallel to a first direction and a second direction intersecting the first direction, and in a direction intersecting the light exit surface, an optical beam having a shape extending in the second direction and that is configured to cause a direction of emission of the optical beam to change along the first direction; and
an optical element, placed on a path of the optical beam, that expands an extent of spread of the optical beam in the second direction, wherein;
the optical element includes at least one mirror having a curvature in the second direction, and
the mirror reflects the optical beam emitted from the light exit surface of the optical deflector.
2. The optical device according to claim 1, wherein the mirror is a convex mirror.
3. The optical device according to claim 1, wherein the mirror is a concave mirror.
4. The optical device according to claim 1, wherein the optical element has a portion in which the curvature of the mirror changes along the first direction.
5. The optical device according to claim 1, wherein the optical deflector includes
a first mirror and a second mirror that face each other and that extend in the first direction, and
an optical waveguide layer, located between the first mirror and the second mirror, that guides light in the first direction.
6. The optical device according to claim 1, wherein the optical deflector includes
a plurality of optical waveguides, arranged along the first direction, that extend along the second direction, and
a plurality of phase shifters connected separately to each of the plurality of optical waveguides.
7. The optical device according to claim 6, wherein
each of the plurality of optical waveguides is provided with a grating, and
the optical beam is emitted via the grating.
8. An optical device comprising:
an optical deflector that emits, through a light exit surface parallel to a first direction and a second direction intersecting the first direction, and in a direction intersecting the light exit surface, an optical beam having a shape extending in the second direction and that is configured to cause a direction of emission of the optical beam to change along the first direction; and
an optical element, placed on a path of the optical beam, that changes an extent of spread of the optical beam in the second direction, wherein;
the optical element has a first surface on which the optical beam falls and a second surface through which the optical beam exits, and
a distance between the light exit surface and the first or second surface of the optical element along a direction perpendicular to the light exit surface changes along the first direction.
9. The optical device according to claim 8, wherein the optical element includes at least one lens having a curvature in the second direction and has a portion in which the curvature of the lens changes along the first direction.
10. The optical device according to claim 8, wherein
the optical element includes at least one lens having a curvature in the second direction and has a portion in which the curvature of the lens is constant along the first direction, and the first or second surface of the optical element in the portion is inclined along the first direction with respect to the light exit surface.

11. The optical device according to claim 8, wherein a curvature of the optical element in the second direction is different from a curvature of the optical element in the first direction.

12. The optical device according to claim 8, wherein the optical element expands a steering angle of the optical beam in the first direction.

13. The optical device according to claim 9, wherein the optical element has the curvature in the first direction on a light incident side of the lens.

14. The optical device according to claim 9, wherein the lens is a concave lens having a concave surface.

* * * * *